United States Patent
Shimizu

(10) Patent No.: US 10,274,523 B2
(45) Date of Patent: Apr. 30, 2019

(54) CURRENT SENSOR INCLUDING A FIRST CURRENT SENSOR AND A SECOND CURRENT SENSOR UNIT

(71) Applicant: Murata Manufacturing Co., Ltd., Nagaokakyo-shi, Kyoto-fu (JP)

(72) Inventor: Yasuhiro Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/794,077

(22) Filed: Oct. 26, 2017

(65) Prior Publication Data

US 2018/0045762 A1    Feb. 15, 2018

Related U.S. Application Data

(63) Continuation of application No. PCT/JP2016/071347, filed on Jul. 21, 2016.

(30) Foreign Application Priority Data

Jul. 24, 2015    (JP) ................................ 2015-146574

(51) Int. Cl.
*G01R 15/20*    (2006.01)
*G01R 19/00*    (2006.01)
(Continued)

(52) U.S. Cl.
CPC ......... *G01R 15/20* (2013.01); *G01R 19/0092* (2013.01); *G01R 33/07* (2013.01);
(Continued)

(58) Field of Classification Search
CPC combination set(s) only.
See application file for complete search history.

(56) References Cited

U.S. PATENT DOCUMENTS 6,515,468 B1 *   2/2003   Morimoto ............ G01R 15/207
                                                                324/117 H
2006/0082357 A1   4/2006   Tsukamoto

FOREIGN PATENT DOCUMENTS

EP         1 028 321 A2    8/2000
JP        2006-112968 A    4/2006
(Continued)

OTHER PUBLICATIONS

Official Communication issued in International Patent Application No. PCT/JP20161071347, dated Oct. 18, 2016.

*Primary Examiner* — Jay Patidar
(74) *Attorney, Agent, or Firm* — Keating & Bennett, LLP

(57) ABSTRACT

A current sensor including first and second current sensor units. Conductors of the first and second current sensor units extend in a length direction and are parallel or substantially parallel to each other with a space therebetween. An arch-shaped portion and an inverted arch-shaped portion of the first current sensor unit are at different positions in the length direction from positions of an arch-shaped portion and an inverted arch-shaped portion of the second current sensor unit. When seen in a width direction perpendicular or substantially perpendicular to the length direction, first and second magnetic sensor elements of the first current sensor unit are outside an opening of the second current sensor unit and first and second magnetic sensor elements of the second current sensor unit are outside an opening of the first current sensor unit.

20 Claims, 16 Drawing Sheets

(51) Int. Cl.
*G01R 33/07* (2006.01)
*G01R 33/09* (2006.01)
*G01V 3/10* (2006.01)

(52) U.S. Cl.
CPC ............. *G01R 33/09* (2013.01); *G01V 3/108* (2013.01); *G01V 3/101* (2013.01)

(56) References Cited

FOREIGN PATENT DOCUMENTS

| | | |
|---|---|---|
| JP | 2007-078418 A | 3/2007 |
| JP | 2008-039734 A | 2/2008 |
| JP | 2013-108787 A | 6/2013 |
| JP | 2013-142569 A | 7/2013 |
| JP | 2013-170878 A | 9/2013 |

* cited by examiner

CURRENT SENSOR INCLUDING A FIRST CURRENT SENSOR AND A SECOND CURRENT SENSOR UNIT

CROSS REFERENCE TO RELATED APPLICATIONS

This application claims the benefit of priority to Japanese Patent Application No. 2015-146574 filed on Jul. 24, 2015 and is a Continuation application of PCT Application No. PCT/JP2016/071347 filed on Jul. 21, 2016. The entire contents of each application are hereby incorporated herein by reference.

BACKGROUND OF THE INVENTION

1. Field of the Invention

The present invention relates to a current sensor that measures a magnetic field generated in accordance with a current to be measured so as to detect a value of the current to be measured.

2. Description of the Related Art

Japanese Unexamined Patent Application Publication No. 2013-170878 discloses the structure of a current sensor. In the current sensor described in Japanese Unexamined Patent Application Publication No. 2013-170878, a plurality of current paths are disposed in a single plane. Each of the plurality of current paths has a first conductor unit, a second conductor unit connected to one end of the first conductor unit, and a third conductor unit connected to the other end of the first conductor unit. The adjacent second conductor unit is disposed on an extended line that extends from the one end of the first conductor unit in the length direction of the first conductor unit. The adjacent third conductor unit is disposed on an extended line that extends from the other end of the first conductor unit in the length direction of the first conductor unit. A pair of magneto-electro transducers are symmetrically arranged such that the first conductor unit are interposed between the pair of the magneto-electro transducers and the pair of the magneto-electro transducers are disposed at positions perpendicular or substantially perpendicular to the above-described plane so as to detect a magnetic field produced by the first conductor unit.

In the current sensor described in Japanese Unexamined Patent Application Publication No. 2013-170878, the conductor units of the plurality of current paths are bent in a single plane so as to change directions in which the currents flow. This suppresses influence of the current path adjacent to a corresponding current path on the magneto-electro transducers that detect the magnetic field of the corresponding current path.

When the conductor units of the plurality of current paths are bent in a single plane, a planar space occupied by the current paths increases. This inhibits size reduction of the current sensor. In order to realize size reduction of the current sensor, the distance between the current paths adjacent to each other may be decreased. In this case, the magnetic field circling around the first conductor unit of the current path adjacent to the corresponding current path affects the magneto-electro transducers. This increases measurement errors of the current sensor.

SUMMARY OF THE INVENTION

Preferred embodiments of the present invention provide compact current sensors in which an influence of an external magnetic field and a magnetic field circling around a conductor adjacent to a corresponding conductor is suppressed so as to decrease measurement errors.

A current sensor according to a preferred embodiment of the present invention includes a first current sensor unit and a second current sensor unit. Each of the first current sensor unit and the second current sensor unit includes a plate-shaped conductor, a first magnetic sensor element and, a second magnetic sensor element. A current to be measured flows through the conductor. The conductor includes a front surface and a rear surface. The conductor has a length direction, a width direction perpendicular or substantially perpendicular to the length direction, and a thickness direction perpendicular or substantially perpendicular to the length direction and the width direction. The first magnetic sensor element and the second magnetic sensor element detect strength of a magnetic field generated by the current. In each of the first current sensor unit and the second current sensor unit, the conductor includes a first flow path portion and a second flow path portion that allow the current to be divided in a middle portion in the length direction and to flow therethrough. When seen in the width direction, a surrounded region is defined by the first flow path portion and the second flow path portion. When seen in the width direction, the first magnetic sensor element is disposed at a position that is in the region and on a rear surface side of the first flow path portion. When seen in the width direction, the second magnetic sensor element is disposed at a position that is in the region and on a front surface side of the second flow path portion. The conductors of the first current sensor unit and the second current sensor unit extend in the length direction and are disposed parallel or substantially parallel to each other with a space set therebetween. The region of the first current sensor unit and the region of the second current sensor unit are disposed at different positions from each other in the length direction, and due to this difference in position, the first magnetic sensor element and the second magnetic sensor element of the first current sensor unit are positioned outside the region of the second current sensor unit when seen in the width direction and the first magnetic sensor element and the second magnetic sensor element of the second current sensor unit are positioned outside the region of the first current sensor unit when seen in the width direction.

According to a preferred embodiment of the present invention, in the width direction, the conductors of the first current sensor unit and the second current sensor unit are positioned side-by-side with a space provided therebetween. When seen in the width direction, the first magnetic sensor element and the second magnetic sensor element of the first current sensor unit are superposed on the conductor of the second current sensor unit. When seen in the width direction, the first magnetic sensor element and the second magnetic sensor element of the second current sensor unit are superposed on the conductor of the first current sensor unit.

According to a preferred embodiment of the present invention, in the thickness direction, the conductors of the first current sensor unit and the second current sensor unit are positioned side-by-side with a space provided therebetween. When seen in the thickness direction, the first magnetic sensor element and the second magnetic sensor element of the first current sensor unit are superposed on the conductor of the second current sensor unit. When seen in the thickness direction, the first magnetic sensor element and the second magnetic sensor element of the second current sensor unit are superposed on the conductor of the first current sensor unit.

According to a preferred embodiment of the present invention, the conductor includes an arch-shaped portion that is bent so as to project toward one side in the thickness direction, that extends in the length direction, and that is included in the first flow path portion.

According to a preferred embodiment of the present invention, the conductor further includes an inverted arch-shaped portion that is bent so as to project toward another side in the thickness direction, that extends in the length direction, and that is included in the second flow path portion.

According to a preferred embodiment of the present invention, in each of the first current sensor unit and the second current sensor unit, a shape of the arch-shaped portion and a shape of the inverted arch-shaped portion are identical to each other.

According to a preferred embodiment of the present invention, when seen in the width direction, the first flow path portion bulges out on the front surface side of the conductor.

According to a preferred embodiment of the present invention, when seen in the width direction, the second flow path portion bulges out on the rear surface side of the conductor.

According to a preferred embodiment of the present invention, each of the first flow path portion and the second flow path portion includes one end and another end in the length direction. The one end of the first flow path portion and the other end of the first flow path portion in the length direction are at different positions from each other in the thickness direction. The one end of the second flow path portion and the other end of the second flow path portion in the length direction are disposed at different positions from each other in the thickness direction. The one end of the first flow path portion and the one end of the second flow path portion in the length direction are located at identical positions to each other in the thickness direction. The other end of the first flow path portion and the other end of the second flow path portion in the length direction are located at identical positions to each other in the thickness direction. The first flow path portion includes a bent portion that connects a position of the one end of the first flow path portion and a position of the other end of the first flow path portion in the thickness direction to each other. The second flow path portion includes a bent portion that connects a position of the one end of the second flow path portion and a position of the other end of the second flow path portion in the thickness direction to each other. The bent portion of the first flow path portion and the bent portion of the second flow path portion are spaced from each other in the length direction.

According to a preferred embodiment of the present invention, in each of the first current sensor unit and the second current sensor unit, the conductor includes a slit that extends in the length direction, and, due to the slit, the first flow path portion and the second flow path portion are spaced from each other in the width direction.

According to a preferred embodiment of the present invention, in each of the first current sensor unit and the second current sensor unit, the slit is positioned at a center or an approximate center of the conductor in the width direction.

According to a preferred embodiment of the present invention, in each of the first current sensor unit and the second current sensor unit, the first magnetic sensor element and the second magnetic sensor element are mounted in or on a single board.

According to a preferred embodiment of the present invention, each of the first current sensor unit and the second current sensor unit further includes a calculator that calculates a value of the current by performing computation on a detection value of the first magnetic sensor element and a detection value of the second magnetic sensor element. In each of the first current sensor unit and the second current sensor unit, with respect to the strength of the magnetic field generated by the current flowing through the conductor, a phase of the detection value of the first magnetic sensor element and a phase of the detection value of the second magnetic sensor element are opposite to each other, and the calculator is a subtractor or a differential amplifier.

According to a preferred embodiment of the present invention, each of the first current sensor unit and the second current sensor unit further includes a calculator that calculates a value of the current by performing computation on a detection value of the first magnetic sensor element and a detection value of the second magnetic sensor element. In each of the first current sensor unit and the second current sensor unit, with respect to the strength of the magnetic field generated by the current flowing through the conductor, the detection value of the first magnetic sensor element and the detection value of the second magnetic sensor element are in phase with each other, and the calculator is an adder or a summing amplifier.

According to a preferred embodiment of the present invention, in each of the first current sensor unit and the second current sensor unit, the first magnetic sensor element and the second magnetic sensor element have respective detection axes and are disposed so that the detection axes are oriented in the width direction, and detection sensitivity of each of the first magnetic sensor element and the second magnetic sensor element varies in accordance with a strength of a bias magnetic field in the length direction.

According to various preferred embodiments of the present invention, in the current sensors, an influence of the external magnetic field and the magnetic field circling around the conductor adjacent to the corresponding conductor is suppressed. Thus, measurement errors are decreased and size-reduction is realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
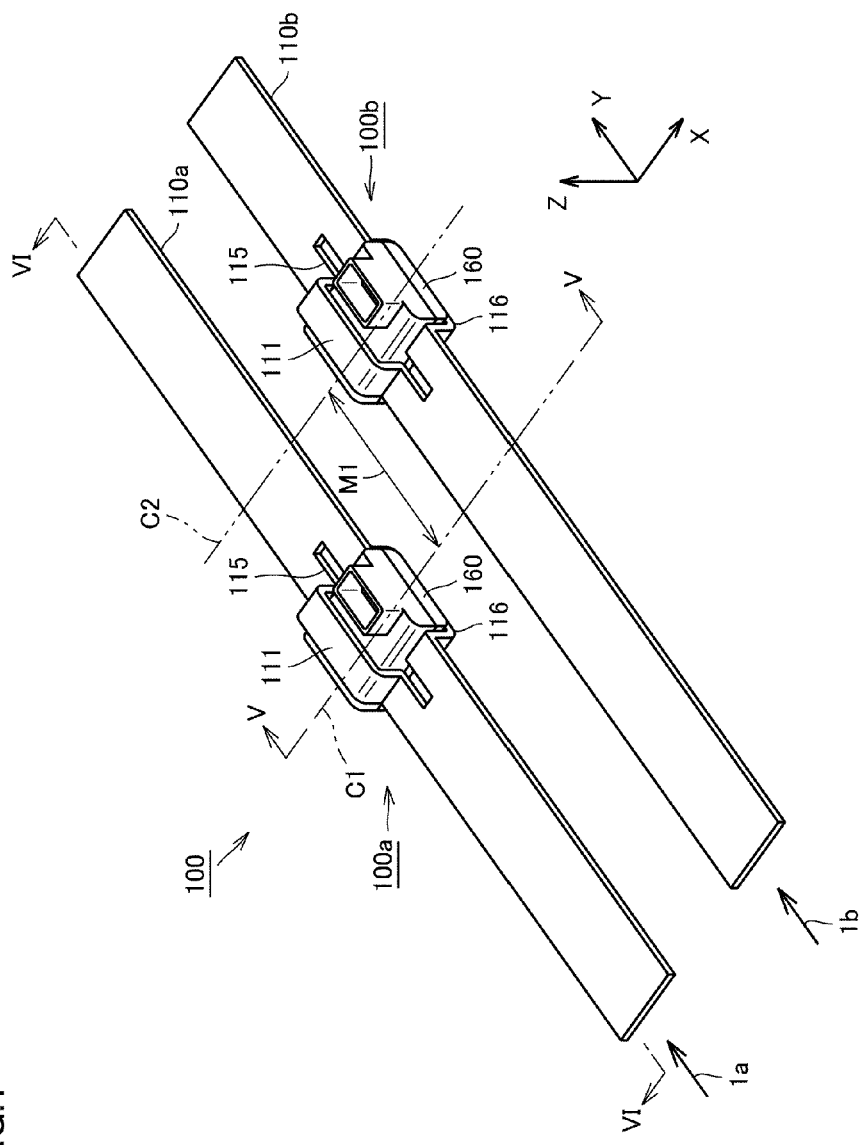
FIG. 1 is a perspective view of the appearance of a current sensor according to a first preferred embodiment of the present invention.

Current sensors according to preferred embodiments of the present invention will be described below with reference to the drawings. In the following description of the preferred embodiments, like or corresponding elements in the drawings are denoted by like numerals and repetition of the description thereof is avoided.

First Preferred Embodiment

Figure 2:
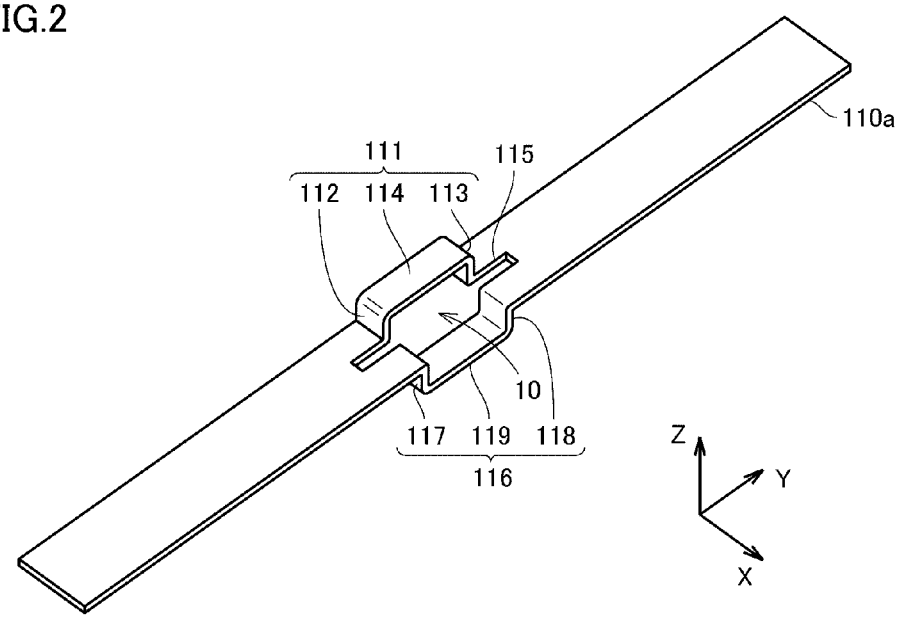
FIG. 2 is a perspective view of the appearance of a primary conductor included in the current sensor according to the first preferred embodiment of the present invention.
Figure 3:
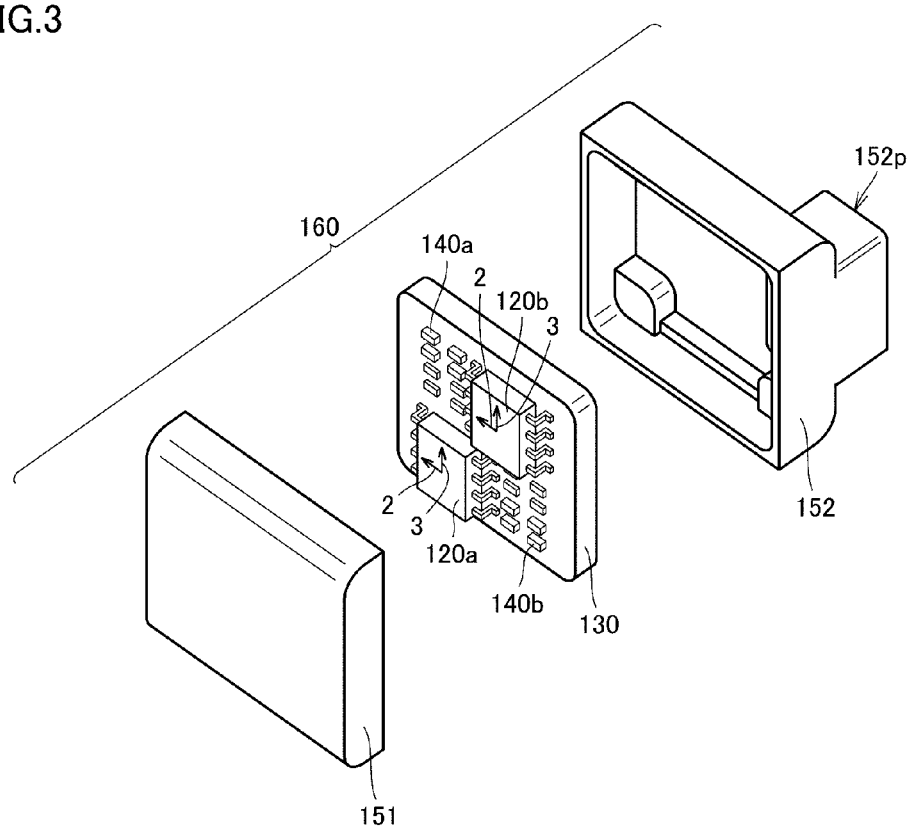
FIG. 3 is an exploded perspective view of the structure of a magnetic sensor unit included in the current sensor according to the first preferred embodiment of the present invention.
Figure 4:
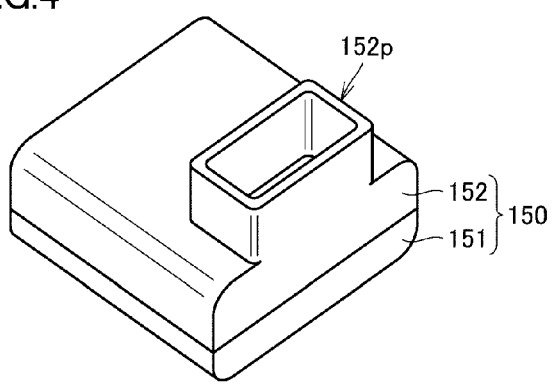
FIG. 4 is a perspective view of the appearance of a housing of the magnetic sensor unit included in the current sensor according to the first preferred embodiment of the present invention.
Figure 5:
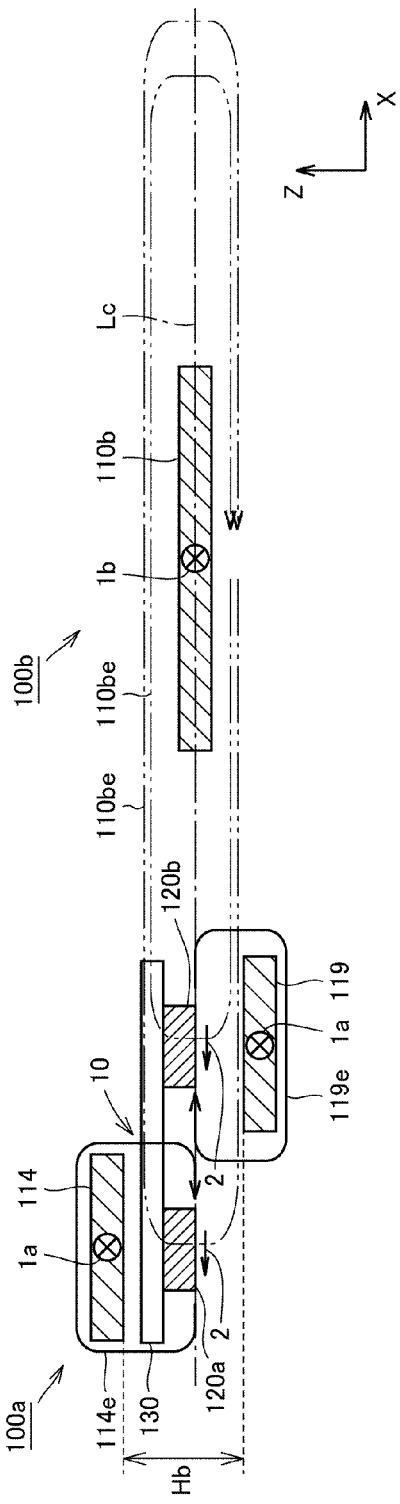
FIG. 5 is a sectional view of the current sensor according to the first preferred embodiment of the present invention seen in an arrow direction of line V-V illustrated in FIG. 1.
Figure 6:
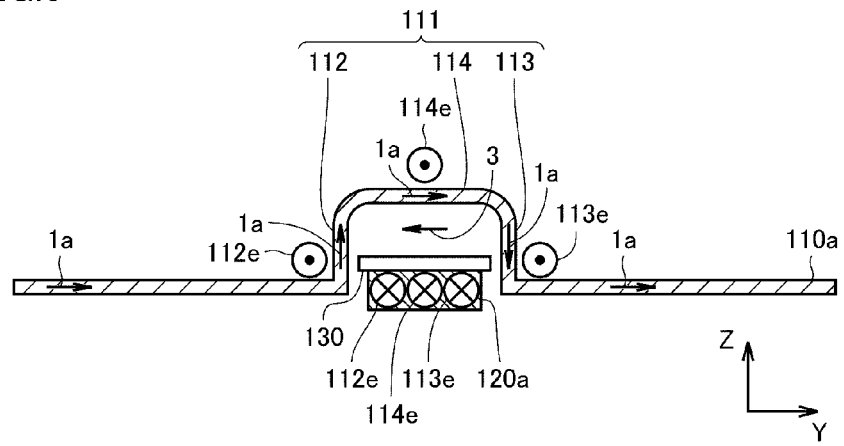
FIG. 6 is a sectional view of the current sensor according to the first preferred embodiment of the present invention seen in an arrow direction of line VI-VI illustrated in FIG. 1.
Figure 7:
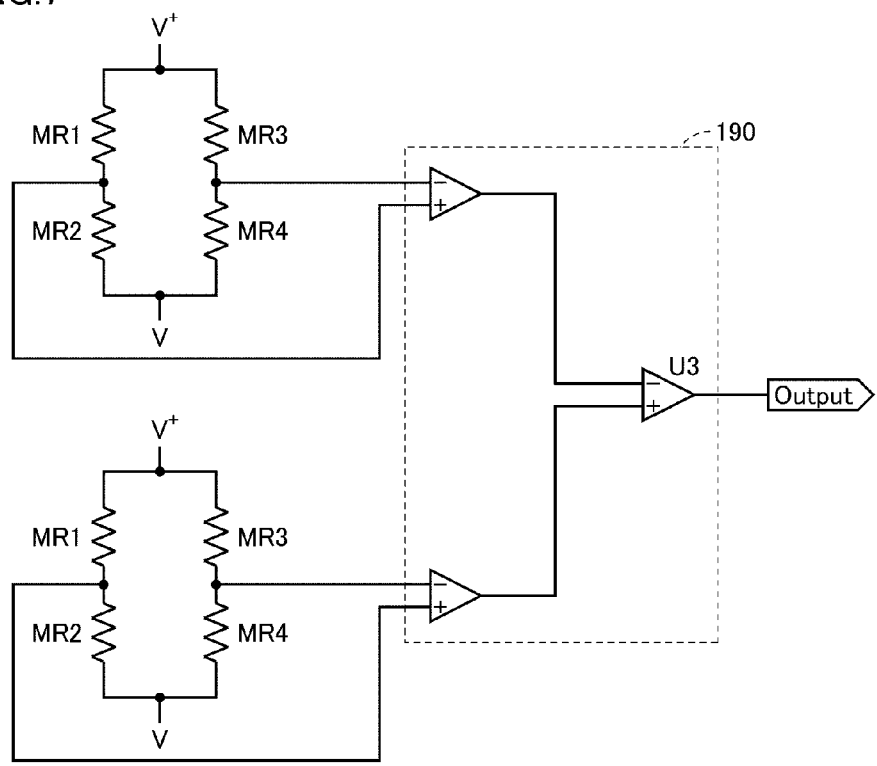
FIG. 7 is a circuit diagram of a circuit configuration of the current sensor according to the first preferred embodiment of the present invention.

FIG. 1 is a perspective view of the appearance of a current sensor according to a first preferred embodiment of the present invention. FIG. 2 is a perspective view of the appearance of a primary conductor included in the current sensor according to the first preferred embodiment of the present invention. FIG. 3 is an exploded perspective view of the structure of a magnetic sensor unit included in the current sensor according to the first preferred embodiment of the present invention. FIG. 4 is a perspective view of the appearance of a housing of the magnetic sensor unit included in the current sensor according to the first preferred embodiment of the present invention. FIG. 5 is a sectional view of the current sensor according to the first preferred embodiment of the present invention seen in an arrow direction of line V-V illustrated in FIG. 1. FIG. 6 is a sectional view of the current sensor according to the first preferred embodiment of the present invention seen in an arrow direction of line VI-VI illustrated in FIG. 1. FIG. 7 is a circuit diagram of a circuit configuration of the current sensor according to the first preferred embodiment of the present invention.

In FIGS. 1, 2, 5, and 6, the width direction, the length direction, and the thickness direction of primary conductors 110a and 110b defining and functioning as conductors to be described later are respectively represented as the X-axis direction, the Y-axis direction, and the Z-axis direction. Illustration of a housing 150 is omitted from FIGS. 5 and 6. In FIG. 5, Lc denotes center lines that extend in the width direction (X-axis direction) of the primary conductors 110a and 110b and that pass through the center of a first magnetic sensor element 120a and the center of a second magnetic sensor element 120b. The first magnetic sensor element 120a and the second magnetic sensor element 120b will be described later. FIG. 7 illustrates a circuit configuration of a portion corresponding to each of the primary conductors 110a and 110b.

As illustrated in FIGS. 1 to 7, a current sensor 100 according to the first preferred embodiment of the present invention includes a first current sensor unit 100a and a second current sensor unit 100b. Although the current sensor 100 includes two current sensor units according to the present preferred embodiment, the number of the current sensor units included in the current sensor is not limited to two. It is sufficient that the current sensor include a plurality of the current sensor units. For example, when the current sensor 100 is used in wiring of a three-phase three-wire system, the current sensor 100 includes three current sensor units.

The first current sensor unit 100a and the second current sensor unit 100b respectively include primary conductors 110a and 110b. The primary conductors 110a and 110b each allow a current to be measured to flow therethrough. Each of the first current sensor unit 100a and the second current sensor unit 100b includes the first and second magnetic sensor elements 120a and 120b that detect the strength of a magnetic field generated by the current to be measured flowing through a corresponding one of the primary conductors 110a and 110b. Specifically, each of the primary conductors 110a and 110b includes a front surface and rear surface and has a plate shape that has the length direction (Y-axis direction), the width direction (X-axis direction) perpendicular or substantially perpendicular to the length direction (Y-axis direction), and the thickness direction (Z-axis direction) perpendicular or substantially perpendicular to the length direction (Y-axis direction) and the width direction (X-axis direction).

In each of the first current sensor unit 100a and the second current sensor unit 100b, as will be described later, the current to be measured flows through each of the primary conductors 110a and 110b in the length direction (Y-axis direction) of the primary conductors 110a and 110b as indicated by a corresponding one of arrows 1a and 1b while being divided into two flow paths. Each of the primary conductors 110a and 110b includes a first flow path portion and a second flow path portion that allow the current to be measured to be divided in a middle portion in the length direction (Y-axis direction) and to flow therethrough.

Each of the primary conductors 110a and 110b includes an arch-shaped portion 111 and an inverted arch-shaped portion 116. The arch-shaped portion 111 extends in the length direction (Y-axis direction) while being bent so as to project toward one side in the thickness direction (Z-axis direction) of the primary conductors 110a and 110b, and defines and functions as the first flow path portion as one of the two flow paths. The inverted arch-shaped portion 116 extends in the length direction (Y-axis direction) while being bent so as to project toward the other side in the thickness direction (Z-axis direction), and defines and functions as the second flow path portion as the other of the two flow paths. That is, when seen in the width direction (X-axis direction) of the primary conductors 110a and 110b, the first flow path portion bulges out on the front surface side of each of the primary conductors 110a and 110b. When seen in the width direction (X-axis direction) of the primary conductors 110a and 110b, the second flow path portion bulges out on the rear surface side of each of the primary conductors 110a and 110b.

The arch-shaped portion 111 and the inverted arch-shaped portion 116 are positioned side-by-side in the width direction (X-axis direction) of the primary conductors 110a and 110b such that an opening 10 is provided inside the arch-shaped portion 111 and the inverted arch-shaped portion 116. That is, when seen in the width direction (X-axis direction) of the primary conductors 110a and 110b, the opening 10 that is a region surrounded by the first flow path portion and the second flow path portion is provided.

As illustrated in FIG. 2, according to the present preferred embodiment, the arch-shaped portion 111 includes a first projecting portion 112, a second projecting portion 113, and an extended portion 114. The first projecting portion 112 and the second projecting portion 113 are spaced from each other and project so as to be perpendicular or substantially perpendicular to a main surface of a corresponding one of the primary conductors 110a and 110b. The extended portion 114 extends in the length direction (Y-axis direction) of the primary conductors 110a and 110b so as to connect the first projecting portion 112 and the second projecting portion 113 to each other. Despite this, the shape of the arch-shaped portion 111 is not limited to the above description. For example, the arch-shaped portion 111 may have a C shape or a semi-circular shape when seen in the width direction (X-axis direction) of the primary conductors 110a and 110b.

The inverted arch-shaped portion 116 include a third projecting portion 117, a fourth projecting portion 118, and an extended portion 119. The third projecting portion 117 and the fourth projecting portion 118 are spaced from each other and project so as to be perpendicular or substantially perpendicular to the main surface of a corresponding one of the primary conductors 110a and 110b. The extended portion 119 extends in the length direction (Y-axis direction) of the primary conductors 110a and 110b so as to connect the third projecting portion 117 and the fourth projecting portion 118 to each other. Despite this, the shape of the inverted arch-shaped portion 116 is not limited to the above description. For example, the inverted arch-shaped portion 116 may have a C shape or a semi-circular shape when seen in the width direction (X-axis direction) of the primary conductors 110a and 110b. Although the shapes of the arch-shaped portion 111 and the inverted arch-shaped portion 116 are the same according to the present preferred embodiment, the shapes of the arch-shaped portion 111 and the inverted arch-shaped portion 116 may be different from each other. The distance between the extended portion 114 and the extended portion 119 in the thickness direction (Z-axis direction) of the primary conductors 110a and 110b is Hb.

The primary conductors 110a and 110b each include a slit 115 that extends in the length direction (Y-axis direction) thereof. The slit 115 is adjacent to the arch-shaped portion 111 in the width direction (X-axis direction) of the primary conductors 110a and 110b. The slit 115 is not necessarily provided. The slit 115 is positioned at the center of each of the primary conductors 110a and 110b in the width direction (X-axis direction) of the primary conductors 110a and 110b. The slit 115 is interposed between the arch-shaped portion 111 and the inverted arch-shaped portion 116. That is, with the slit 115, the first flow path portion and the second flow path portion are spaced from each other in the width direction (X-axis direction) of the primary conductors 110a and 110b.

Although the slit 115 abuts the entirety of the arch-shaped portion 111 in the length direction (Y-axis direction) of the primary conductors 110a and 110b according to the present preferred embodiment, the range in which the slit 115 is provided is not limited to this. The slit 115 may be provided so as to abut a portion of the arch-shaped portion 111. Furthermore, although the slit 115 has a rectangular or substantially rectangular shape when seen in the thickness direction (Z-axis direction) of the primary conductors 110a and 110b, the shape of the slit 115 is not limited to this and may be, for example, an elliptical or substantially elliptical shape.

The primary conductors 110a and 110b of the first current sensor unit 100a and the second current sensor unit 100b extend in the length direction (Y-axis direction) and are disposed parallel or substantially parallel to each other with a space set therebetween. According to the present preferred embodiment, the primary conductors 110a and 110b are positioned side by side with the space set therebetween in the width direction (X-axis direction). However, the direction in which the primary conductors are positioned is not limited to the width direction (X-axis direction). The primary conductors may be positioned in an arbitrary direction. The arch-shaped portion 111 and the inverted arch-shaped portion 116 of the first current sensor unit 100a are disposed at different positions from the positions of the arch-shaped portion 111 and the inverted arch-shaped portion 116 of the second current sensor unit 100b in the length direction (Y-axis direction).

Specifically, as illustrated in FIG. 1, the position of a center line C1 that passes through the center of the opening 10 of the primary conductor 110a and extends in the width direction (X-axis direction) is spaced from the position of a center line C2 that passes through the center of the opening 10 of the primary conductor 110b and extends in the width direction (X-axis direction) by a distance M1 in the length direction (Y-axis direction).

According to the present preferred embodiment, the primary conductors 110a and 110b are preferably made of copper. However, the material of the primary conductors 110a and 110b is not limited to this. The primary conductors 110a and 110b may be made of metal such as silver, aluminum, or steel or an alloy that contains any of these types of metal.

Surface treatment may be performed on the primary conductors 110a and 110b. For example, at least one plated layer of a metal such as nickel, tin, silver, or copper or an alloy that contains any of these types of metal may be provided on the surfaces of the primary conductors 110a and 110b.

According to the present preferred embodiment, the primary conductors 110a and 110b are preferably formed by press work. However, the method of forming the primary conductors 110a and 110b is not limited to this. The primary conductors 110a and 110b may be formed by, for example, cutting work or casting work.

As illustrated in FIG. 3, the first magnetic sensor element 120a and the second magnetic sensor element 120b are mounted in or on a board 130 together with electronic components 140a and 140b such as an amplifier and a passive element. According to the present preferred embodiment, the first magnetic sensor element 120a is disposed at a different position from the position of the second magnetic sensor element 120b in the length direction (Y-axis direction) of the primary conductors 110a and 110b while being positioned side-by-side in the width direction (X-axis direction) of the primary conductors 110a and 110b. A magnetic sensor unit 160 is configured by securing the board 130 in the housing 150 having electrically insulating properties. That is, the first magnetic sensor element 120a, the second magnetic sensor element 120b, the electronic components 140a and 140b, and the board 130 are housed in the housing 150.

The board 130 is a printed wiring board that includes a base material such as glass epoxy or alumina and wiring preferably formed by patterning foil of metal such as copper provided on a surface of the base material.

As illustrated in FIGS. 3 and 4, the housing 150 preferably has a rectangular or substantially rectangular parallelepiped shape and includes a lower housing 151 and an upper housing 152. The upper housing 152 includes an extracting opening 152p for a wire harness connected to the board 130.

The housing 150 is preferably made of an engineering plastic such as PPS (Polyphenylenesulfide). When heat generation by the primary conductors 110a and 110b is considered, PPS, which is highly heat resistant, is preferred as the material of the housing 150.

Examples of a method of securing the board 130 to the housing 150 may include fastening with screws, heat welding with resin, joining with an adhesive, and so forth. When fastening the board 130 and the housing 150 to each other with screws, use of non-magnetic screws is preferred so as to prevent the magnetic field from being disturbed.

The magnetic sensor unit 160 is inserted into the opening 10 defined by the arch-shaped portion 111 and the inverted arch-shaped portion 116. Thus, the first magnetic sensor element 120a is disposed inside the arch-shaped portion 111 so as to be positioned on the rear surface side of the extended portion 114, and the second magnetic sensor element 120b is disposed inside the inverted arch-shaped portion 116 so as to be positioned on the front surface side of the extended portion 119. That is, when seen in the width direction (X-axis direction) of the primary conductors 110a and 110b, the first magnetic sensor element 120a is disposed at a position that is in the above-described region and on the rear surface side of the one of the flow path portions. The second magnetic sensor element 120b is, when seen in the width direction (X-axis direction) of the primary conductors 110a and 110b, disposed at a position that is in the above-described region and on the front surface side of the other of the flow path portions.

When seen in the thickness direction (Z-axis direction) of the primary conductors 110a and 110b, the slit 115 is positioned between the first magnetic sensor element 120a and the second magnetic sensor element 120b. In each of the first current sensor unit 100a and the second current sensor unit 100b, when seen in the thickness direction (Z-axis direction) of the primary conductors 110a and 110b, the slit 115 is at a position intermediate between the first magnetic sensor element 120a and the second magnetic sensor element 120b in the width direction (X-axis direction) of the primary conductors 110a and 110b.

In the above-described state, the housing 150 is in contact with at least a portion of a surface in an inner side portion of the arch-shaped portion 111. For example, the upper housing 152 is in contact with at least a portion of the rear surface of the extended portion 114. Furthermore, the housing 150 is in contact with at least a portion of a surface in an inner side portion of the inverted arch-shaped portion 116. For example, the lower housing 151 is in contact with at least a portion of the front surface of the extended portion 119.

As illustrated in FIGS. 1 and 5, when seen in the width direction (X-axis direction) of the primary conductors 110a and 110b, the first magnetic sensor element 120a and the second magnetic sensor element 120b of the first current sensor unit 100a are positioned outside the opening 10 of the second current sensor unit 100b. In addition, when seen in the width direction (X-axis direction) of the primary conductors 110a and 110b, the first magnetic sensor element 120a and the second magnetic sensor element 120b of the second current sensor unit 100b are positioned outside the opening 10 of the first current sensor unit 100a.

When seen in the width direction (X-axis direction) of the primary conductors 110a and 110b, the first magnetic sensor element 120a and the second magnetic sensor element 120b of the first current sensor unit 100a are superposed on the primary conductor 110b of the second current sensor unit 100b. In addition, when seen in the width direction (X-axis direction) of the primary conductors 110a and 110b, the first magnetic sensor element 120a and the second magnetic sensor element 120b of the second current sensor unit 100b are superposed on the primary conductor 110a of the first current sensor unit 100a.

Preferably, the center lines Lc that respectively pass through the center of the first magnetic sensor element 120a and the center of the second magnetic sensor element 120b of the first current sensor unit 100a are at positions intermediate between the extended portion 114 and the extended portion 119 of the primary conductor 110a. That is, in the thickness direction (Z-axis direction) of the primary conductor 110a, both the distance between the lower surface of the extended portion 114 and the center lines Lc and the distance between the upper surface of the extended portion 119 and the center lines Lc are Hb/2.

Preferably, the center lines Lc that respectively pass through magnetosensitive surfaces of the first magnetic sensor element 120a and the second magnetic sensor element 120b of the second current sensor unit 100b are at positions intermediate between the extended portion 114 and the extended portion 119 of the primary conductor 110b.

That is, in the thickness direction (Z-axis direction) of the primary conductor 110b, both the distance between the lower surface of the extended portion 114 and the center lines Lc and the distance between the upper surface of the extended portion 119 and the center lines Lc are Hb/2.

The distance M1 between the center line C1 and the center line C2 is set so that a portion of the primary conductor 110b other than the arch-shaped portion 111 and the inverted arch-shaped portion 116 is positioned on the center lines Lc in the first current sensor unit 100a and a portion of the primary conductor 110a other than the arch-shaped portion 111 and the inverted arch-shaped portion 116 is positioned on the center lines Lc in the second current sensor unit 100b.

Although the board 130 is disposed so that a mounting surface of the board 130 is parallel or substantially parallel to the main surface of a corresponding one of the primary conductors 110a and 110b according to the present preferred embodiment, the board 130 may be disposed so that the mounting surface of the board 130 is perpendicular or substantially perpendicular to the main surface of the corresponding one of the primary conductors 110a and 110b.

The first magnetic sensor element 120a and the second magnetic sensor element 120b detect magnetic field in the width direction (X-axis direction) of the primary conductors 110a and 110b. Specifically, as illustrated in FIG. 5, the first magnetic sensor element 120a and the second magnetic sensor element 120b have respective detection axes 2 oriented in the width direction (X-axis direction) of the primary conductors 110a and 110b. That is, the first magnetic sensor element 120a and the second magnetic sensor element 120b have the respective detection axes 2 and are disposed so that the detection axes 2 are oriented in the width direction (X-axis direction) of the primary conductors 110a and 110b.

The first magnetic sensor element 120a and the second magnetic sensor element 120b have an odd function input/output characteristic with which each of the first magnetic sensor element 120a and the second magnetic sensor element 120b outputs a positive value when detecting a magnetic field oriented to one direction of a corresponding one of the detection axes 2 and output a negative value when detecting a magnetic field oriented to the opposite direction to the one direction of the detection axis 2.

As illustrated in FIG. 7, the first magnetic sensor element 120a and the second magnetic sensor element 120b of the current sensor 100 according to the present preferred embodiment each include a Wheatstone bridge-type bridge circuit that includes four AMR (anisotropic magneto resistance) elements. Each of the first magnetic sensor element 120a and the second magnetic sensor element 120b may include magneto resistance elements such as GMR (giant magneto resistance) elements, TMR (tunnel magneto resistance) elements, BMR (ballistic magneto resistance) elements, or CMR (colossal magneto resistance) elements instead of the AMR elements.

Alternatively, each of the first magnetic sensor element 120a and the second magnetic sensor element 120b may include a half-bridge circuit that includes two magneto resistance elements. Other than the above-described elements, magnetic sensor elements including Hall elements, magnetic sensor elements having MI (magneto impedance) elements that utilize magneto impedance, or flux gate-type magnetic sensor elements may be used as the first magnetic sensor element 120a and the second magnetic sensor element 120b. The magnetic elements such as magneto resistance elements or Hall elements may be resin packaged or potted with a material such as silicone resin or epoxy resin.

When a plurality of magnetic elements are packaged, the plurality of magnetic elements may be packaged in a single package or each of the plurality of magnetic elements may be independently packaged. Furthermore, a plurality of magnetic elements and electronic components may be disposed in a single package in an integrated stated.

According to the present preferred embodiment, the AMR elements include barber pole electrodes to obtain the odd function input/output characteristic. Specifically, the magneto resistance elements of the first magnetic sensor element 120a and the second magnetic sensor element 120b include barber pole electrodes. This biases the current so as to flow in a direction inclined at a specified angle relative to a magnetization direction of a magneto resistance film of each of the magneto resistance elements.

The magnetization direction of the magneto resistance film is determined in accordance with at least one of a bias magnetic field and a shape anisotropy of the magneto resistance film. Examples of a method of determining the magnetization direction of the AMR element may include a method in which a permanent magnet or a coil is disposed near the magneto resistance film included in the AMR element so as to apply a bias magnetic field, a method in which exchange coupling is provided in the magneto resistance film included in the AMR element, and so forth. The permanent magnet may include a sintered magnet, a bonded magnet, or a thin film. The type of the permanent magnet is not particularly limited. A ferrite magnet, a samarium-cobalt magnet, an alnico magnet, neodymium magnet, or the like may be used.

The magnetization direction of the magneto resistance film of the magneto resistance element of the first magnetic sensor element 120a and the magnetization direction of the magneto resistance film of the magneto resistance element of the second magnetic sensor element 120b are the same. This decreases degradation of output accuracy due to influence of an external magnetic field.

Detection sensitivity of each of the first magnetic sensor element 120a and the second magnetic sensor element 120b varies in accordance with the strength of the bias magnetic field in the length direction (Y-axis direction) of the primary conductors 110a and 110b. Specifically, as illustrated in FIG. 3, the first magnetic sensor element 120a and the second magnetic sensor element 120b have respective sensitivity variation axes 3 extending perpendicularly or substantially perpendicularly to the detection axes 2. As illustrated in FIGS. 3 and 6, the first magnetic sensor element 120a and the second magnetic sensor element 120b are disposed so that the sensitivity variation axes 3 extend in the length direction (Y-axis direction) of the primary conductors 110a and 110b. That is, the sensitivity variation axes 3 are oriented in the length direction (Y-axis direction) of the primary conductors 110a and 110b.

The output sensitivity of each of the first magnetic sensor element 120a and the second magnetic sensor element 120b varies when a magnetic field in a direction along the sensitivity variation axis 3 is applied. Specifically, the output sensitivity of each of the first magnetic sensor element 120a and the second magnetic sensor element 120b increases when a magnetic field in the opposite direction to a bias magnetic field applying direction is applied in the direction along the sensitivity variation axis 3 and decreases when a magnetic field in the same direction as the bias magnetic field applying direction is applied in the direction along the sensitivity variation axis 3. The output of each of the first magnetic sensor element 120a and the second magnetic sensor element 120*b* is 0 when only the magnetic field in the direction along the sensitivity variation axis 3 is applied.

As illustrated in FIG. 7, the current sensor 100 further includes a calculator 190 that performs computation on a detection value of the first magnetic sensor element 120*a* and a detection value of the second magnetic sensor element 120*b* so as to calculate a value of the current to be measured flowing through a corresponding one of the primary conductors 110*a* and 110*b*. According to the present preferred embodiment, the calculator 190 is a differential amplifier. Alternatively, the calculator 190 may be a subtractor.

As illustrated in FIG. 5, the currents to be measured flowing through the primary conductors 110*a* and 110*b* are each divided so as to flow through two flow paths, that is, the first flow path portion that passes through the arch-shaped portion 111 and the second flow path portion that passes through the inverted arch-shaped portion 116. Since the current flows through the two divided flow paths in each of the primary conductors 110*a* and 110*b*, magnetic fields circling around the flow paths are generated in accordance with a so-called corkscrew rule.

As illustrated in FIGS. 5 and 6, a magnetic field 112*e* circling around the first projecting portion 112, a magnetic field 113*e* circling around the second projecting portion 113, and a magnetic field 114*e* circling around the extended portion 114 are applied to the first magnetic sensor element 120*a*, which is disposed inside the arch-shaped portion 111. This increases the strength of the magnetic field applied to the magneto resistance elements of the first magnetic sensor element 120*a*, thus increasing the sensitivity of the first magnetic sensor element 120*a* to a measurement current flowing through a corresponding one of the primary conductors 110*a* and 110*b*.

A magnetic field circling around the third projecting portion 117, a magnetic field circling around the fourth projecting portion 118, and a magnetic field 119*e* circling around the extended portion 119 are applied to the second magnetic sensor element 120*b*, which is disposed inside the inverted arch-shaped portion 116. This increases the strength of the magnetic field applied to the magneto resistance elements of the second magnetic sensor element 120*b*, thus increasing the sensitivity of the second magnetic sensor element 120*b* to the measurement current flowing through a corresponding one of the primary conductors 110*a* and 110*b*.

As illustrated in FIG. 5, the direction of the magnetic flux in the X-axis direction at a position on the rear surface side of the extended portion 114 is opposite to that at a position on the front surface side of the extended portion 119. That is, the direction of the magnetic flux acting on the first magnetic sensor element 120*a* and the direction of the magnetic flux acting on the second magnetic sensor element 120*b* are opposite to each other. Accordingly, with respect to the strength of the magnetic field generated by the current to be measured flowing through a corresponding one of the primary conductors 110*a* and 110*b*, the phase of the detection value of the first magnetic sensor element 120*a* is opposite to the phase of the detection value of the second magnetic sensor element 120*b*. Accordingly, when the strength of the magnetic field detected by the first magnetic sensor element 120*a* is a positive value, the strength of the magnetic field detected by the second magnetic sensor element 120*b* is a negative value.

The detection value of the first magnetic sensor element 120*a* and the detection value of the second magnetic sensor element 120*b* are subjected to computation performed by the calculator 190. Specifically, the calculator 190 subtracts the detection value of the second magnetic sensor element 120*b* from the detection value of the first magnetic sensor element 120*a*. The value of the current to be measured flowing through the primary conductors 110*a* and 110*b* is calculated in accordance with the result of the above-described computation.

In the current sensor 100 according to the present preferred embodiment, the magnetic sensor unit 160 is inserted into the opening 10. Thus, an external magnetic field source cannot be physically positioned between the first magnetic sensor element 120*a* and the second magnetic sensor element 120*b*.

Accordingly, the direction of a magnetic field component in the detection axis direction out of the magnetic field applied to the first magnetic sensor element 120*a* by an external magnetic field source is the same as the direction of a magnetic field component in the detection axis direction out of the magnetic field applied to the second magnetic sensor element 120*b* by external magnetic field source. Thus, when the strength of the external magnetic field detected by the first magnetic sensor element 120*a* is a positive value, the strength of the external magnetic field detected by the second magnetic sensor element 120*b* is also a positive value.

As a result, when the calculator 190 subtracts the detection value of the second magnetic sensor element 120*b* from the detection value of the first magnetic sensor element 120*a*, the magnetic field from the external magnetic field source is hardly detected. That is, an influence of the external magnetic field is decreased.

As a variation of the present preferred embodiment, in the first magnetic sensor element 120*a* and the second magnetic sensor element 120*b*, the directions of the detection axes for detecting positive detection values may be opposite (180° opposite) to each other. In this case, when the strength of the external magnetic field detected by the first magnetic sensor element 120*a* is a positive value, the strength of the external magnetic field detected by the second magnetic sensor element 120*b* is a negative value.

Meanwhile, with respect to the strength of the magnetic field generated by the current to be measured flowing through a corresponding one of the primary conductors 110*a* and 110*b*, the detection value of the first magnetic sensor element 120*a* and the detection value of the second magnetic sensor element 120*b* are in phase with each other.

According to the present variation, an adder or a summing amplifier is preferably used as the calculator 190 instead of the differential amplifier. With respect to the strength of the external magnetic field, when the detection value of the first magnetic sensor element 120*a* and the detection value of the second magnetic sensor element 120*b* are added by the adder or the summing amplifier, the absolute value of the detection value of the first magnetic sensor element 120*a* and the absolute value of the detection value of the second magnetic sensor element 120*b* are subtracted. Thus, the magnetic field from the external magnetic field source is hardly detected. That is, an influence of the external magnetic field is decreased.

Meanwhile, with respect to the strength of the magnetic field generated by the current flowing through a corresponding one of the primary conductors 110*a* and 110*b*, when the detection value of the first magnetic sensor element 120*a* and the detection value of the second magnetic sensor element 120*b* are added by the adder or the summing amplifier, the value of the current to be measured flowing through a corresponding one of the primary conductors 110*a* and 110*b* is calculated.

As described above, as the calculator, the adder or the summing amplifier may be used instead of the differential amplifier while the polarities of the input/output characteristic of the first magnetic sensor element 120a and the input/output characteristic of the second magnetic sensor element 120b are set to be opposite to each other.

As described above, with the current sensor 100 according to the present preferred embodiment, an influence of the external magnetic field is able to be decreased while the sensitivity of the current sensor 100 is increased by increasing the sensitivity of each of the first magnetic sensor element 120a and the second magnetic sensor element 120b to the measurement current flowing through a corresponding one of the primary conductors 110a and 110b.

As illustrated in FIG. 5, a magnetic field 110be circling around the primary conductor 110b acts on each of the first magnetic sensor element 120a and the second magnetic sensor element 120b of the first current sensor unit 100a in the thickness direction (Z-axis direction) of the primary conductor 110a, which is a direction perpendicular or substantially perpendicular to the detection axes 2. Accordingly, the output of each of the first magnetic sensor element 120a and the second magnetic sensor element 120b of the first current sensor unit 100a due to the magnetic field 110be circling around the primary conductor 110b is substantially 0 or 0. This suppresses an influence of the magnetic field generated by the second current sensor unit 100b on the measurement values of the first current sensor unit 100a. Thus, measurement errors of the first current sensor unit 100a are able to be decreased.

Likewise, a magnetic field circling around the primary conductor 110a acts on each of the first magnetic sensor element 120a and the second magnetic sensor element 120b of the second current sensor unit 100b in the thickness direction (Z-axis direction) of the primary conductor 110b, which is a direction perpendicular or substantially perpendicular to the detection axes 2. Accordingly, the output of each of the first magnetic sensor element 120a and the second magnetic sensor element 120b of the second current sensor unit 100b due to the magnetic field circling around the primary conductor 110a is substantially 0 or 0. This suppresses an influence of the magnetic field generated by the first current sensor unit 100a on the measurement value of the second current sensor unit 100b. Thus, measurement errors of the second current sensor unit 100b are able to be decreased.

As described above, in the current sensor 100 according to the present preferred embodiment, an influence of the external magnetic field and the magnetic field circling around the primary conductor adjacent to the corresponding primary conductor is able to be suppressed. Thus, measurement errors are able to be decreased.

Furthermore, the arch-shaped portion 111 and the inverted arch-shaped portion 116 of the first current sensor unit 100a are disposed at different positions from the positions of the arch-shaped portion 111 and the inverted arch-shaped portion 116 of the second current sensor unit 100b in the length direction (Y-axis direction). Accordingly, an influence of the magnetic field circling around the primary conductor adjacent to the corresponding primary conductor is suppressed. Thus, it is not necessary to bend the primary conductors in a single plane. This decreases a planar space occupied by the primary conductors 110a and 110b, and accordingly, the size of the current sensor 100 is able to be decreased.

Furthermore, in the current sensor 100, each of the first current sensor unit 100a and the second current sensor unit 100b is configured such that the magnetic sensor unit 160 is inserted into the opening 10 so as to be mounted in a corresponding one of the primary conductors 110a and 110b. This configuration facilitates the assembly of the current sensor 100, and the components of the magnetic sensor unit 160 are able to be protected from external forces by the arch-shaped portion 111 and the inverted arch-shaped portion 116. Furthermore, the height of the current sensor 100 is able to be decreased, and integration and size-reduction of the current sensor 100 are able to be realized.

Furthermore, the primary conductors 110a and 110b each include a single conductor. Accordingly, compared to the case where each of the primary conductors 110a and 110b includes a plurality of conductors, the number of components is able to be decreased, thus the cost is able to be decreased.

In the current sensor 100 according to the present preferred embodiment, the electrical resistance value of the arch-shaped portion 111 and the electrical resistance value of the inverted arch-shaped portion 116 are the same or substantially the same. Thus, the heating value of the arch-shaped portion 111 and the heating value of the inverted arch-shaped portion 116 due to flowing of the measurement current through a corresponding one of the primary conductors 110a and 110b are able to be equalized. As a result, the temperature around the magneto resistance elements of the first magnetic sensor element 120a and the temperature around the magneto resistance elements of the second magnetic sensor element 120b are able to be the same or substantially the same. Thus, errors in the measurement value of the current sensor 100 due to the temperature characteristics of the magneto resistance elements are able to be decreased.

Second Preferred Embodiment

A current sensor according to a second preferred embodiment of the present invention will be described below while comparing the current sensor according to the second preferred embodiment with a current sensor according to a comparative example. The configurations of the current sensor units included in the current sensors according to the second preferred embodiment and the comparative example are similar to the configuration of those of the current sensor 100 according to the first preferred embodiment. Accordingly, description of the configuration of the current sensor units is not repeated. The current sensors according to the second preferred embodiment and the comparative example each include three current sensor units and are used for wiring of a three-phase three-wire system such as, for example, an inverter.

Figure 8:
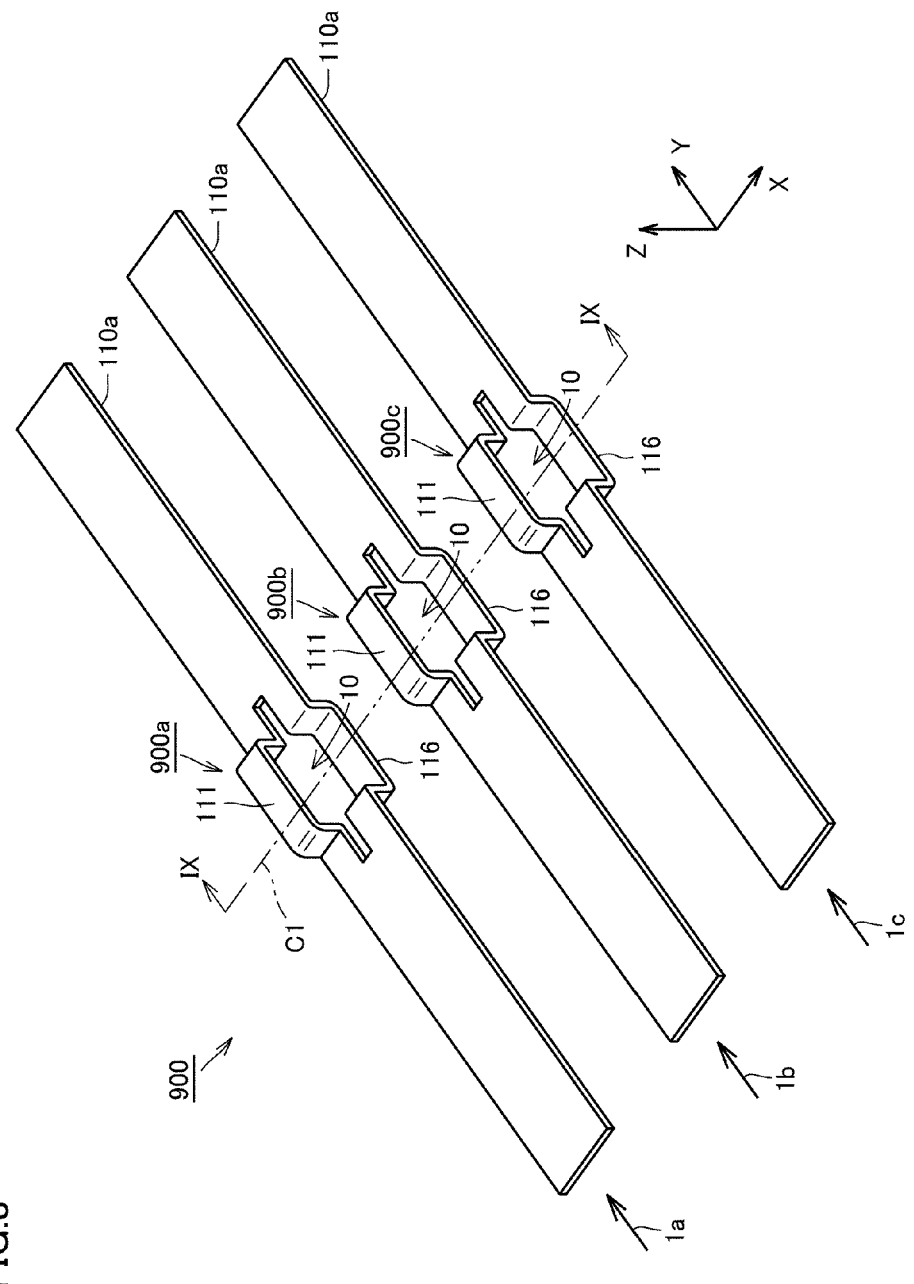
FIG. 8 is a perspective view of the appearance of a current sensor according to a comparative example.
Figure 9:
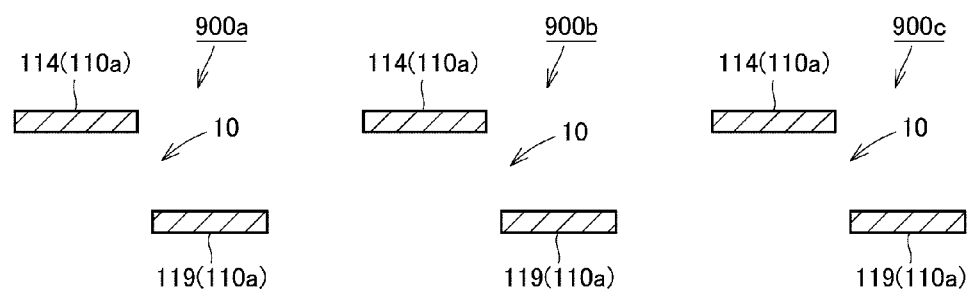
FIG. 9 is a sectional view seen in an arrow direction of line IX-IX illustrated in FIG. 8.
Figure 10:
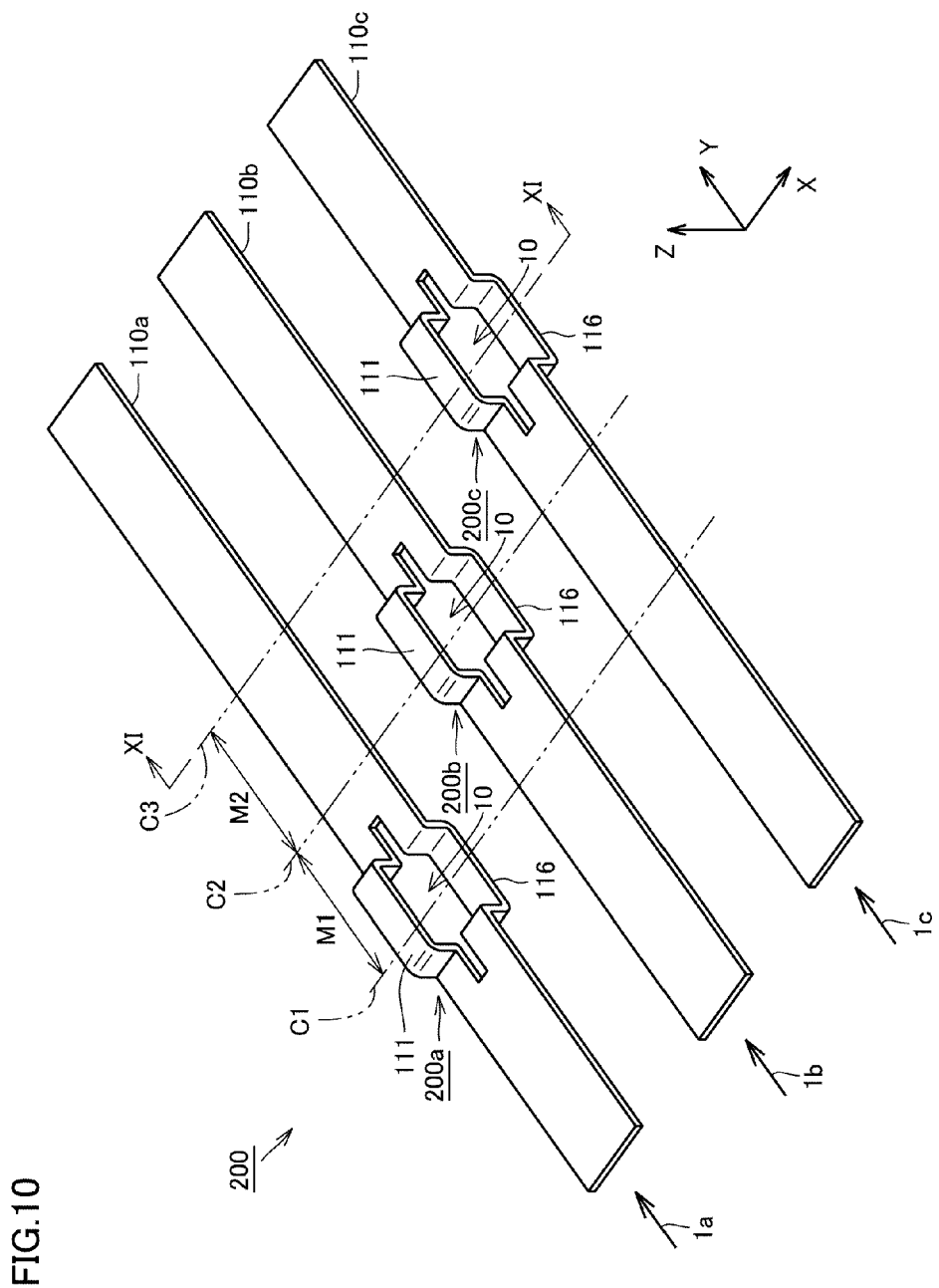
FIG. 10 is a perspective view of the appearance of a current sensor according to a second preferred embodiment of the present invention.
Figure 11:
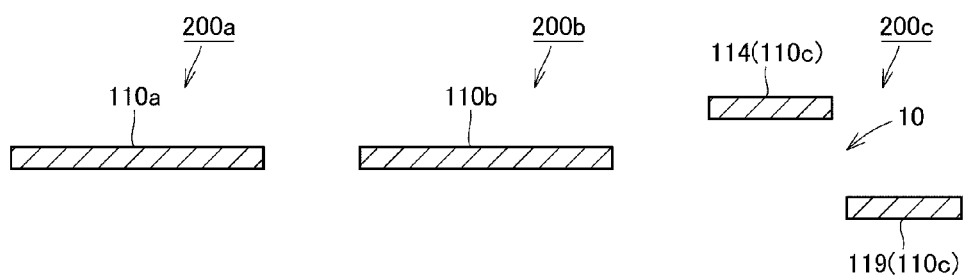
FIG. 11 is a sectional view seen in an arrow direction of line XI-XI illustrated in FIG. 10.

FIG. 8 is a perspective view of the appearance of the current sensor according to the comparative example. FIG. 9 is a sectional view seen in an arrow direction of line IX-IX illustrated in FIG. 8. FIG. 10 is a perspective view of the appearance of the current sensor according to the second preferred embodiment of the present invention. FIG. 11 is a sectional view seen in an arrow direction of line XI-XI illustrated in FIG. 10. Illustration of the magnetic sensor units 160 is omitted from FIGS. 8 to 11.

As illustrated in FIGS. 8 and 9, a current sensor 900 according to the comparative example includes a first current sensor unit 900a, a second current sensor unit 900b, and a third current sensor unit 900c.

Each of the first current sensor unit 900a, the second current sensor unit 900b, and the third current sensor unit 900c includes the primary conductor 110a, the first magnetic sensor element 120a, and the second magnetic sensor element 120b. The primary conductor 110a allows a current to be measured to flow therethrough. The first magnetic sensor element 120a and the second magnetic sensor element 120b detect the strength of a magnetic field generated by the current to be measured flowing through a corresponding one of the primary conductors 110a. Specifically, in each of the first current sensor unit 900a, the second current sensor unit 900b, and the third current sensor unit 900c, the magnetic sensor unit 160 is inserted into the opening 10 of the primary conductor 110a.

In each of the first current sensor unit 900a, the second current sensor unit 900b, and the third current sensor unit 900c, the current to be measured flows through a corresponding one of the primary conductors 110a in the length direction (Y-axis direction) of the primary conductor 110a as indicated by arrows 1a, 1b, and 1c while being divided into two flow paths.

The primary conductors 110a of the first current sensor unit 900a, the second current sensor unit 900b, and the third current sensor unit 900c extend in the length direction (Y-axis direction) and are spaced from one another in the width direction (X-axis direction). The arch-shaped portion 111 and the inverted arch-shaped portion 116 of the first current sensor unit 900a, the arch-shaped portion 111 and the inverted arch-shaped portion 116 of the second current sensor unit 900b, and the arch-shaped portion 111 and the inverted arch-shaped portion 116 of the third current sensor unit 900c are positioned on a virtual line extending in the width direction (X-axis direction) of the primary conductors 110a. That is, center lines C1 that pass through the centers of the openings 10 of the primary conductors 110a of the first current sensor unit 900a, the second current sensor unit 900b, and the third current sensor unit 900c and that extend in the width direction (X-axis direction) are aligned.

As illustrated in FIGS. 10 and 11, a current sensor 200 according to the second preferred embodiment of the present invention includes a first current sensor unit 200a, a second current sensor unit 200b, and a third current sensor unit 200c.

The first current sensor unit 200a, the second current sensor unit 200b, and the third current sensor unit 200c respectively include the primary conductor 110a, the primary conductor 110b, and the primary conductor 110c. Also, the first current sensor unit 200a, the second current sensor unit 200b, and the third current sensor unit 200c each include the first magnetic sensor element 120a and the second magnetic sensor element 120b. The primary conductors 110a, 110b, and 110c each allow a current to be measured to flow therethrough. The first magnetic sensor element 120a and the second magnetic sensor element 120b detect the strength of a magnetic field generated by the current to be measured flowing through a corresponding one of the primary conductors 110a, 110b, and 110c. Specifically, in each of the first current sensor unit 200a, the second current sensor unit 200b, and the third current sensor unit 200c, the magnetic sensor unit 160 is inserted into the opening 10 of a corresponding one of the primary conductors 110a, 110b, and 110c.

In each of the first current sensor unit 200a, the second current sensor unit 200b, and the third current sensor unit 200c, the current to be measured flows through a corresponding one of the primary conductors 110a, 110b, and 110c as indicated by a corresponding one of arrows 1a, 1b, and 1c in the length direction (Y-axis direction) of the primary conductors 110a, 110b, and 110c while being divided into two flow paths.

The primary conductors 110a, 110b, and 110c of the first current sensor unit 200a, the second current sensor unit 200b, and the third current sensor unit 200c extend in the length direction (Y-axis direction) and are spaced from one another in the width direction (X-axis direction). The arch-shaped portion 111 and the inverted arch-shaped portion 116 of the first current sensor unit 200a, the arch-shaped portion 111 and the inverted arch-shaped portion 116 of the second current sensor unit 200b, and the arch-shaped portion 111 and the inverted arch-shaped portion 116 of the third current sensor unit 200c are disposed at different positions from one another in the length direction (Y-axis direction).

Specifically, as illustrated in FIG. 10, a center line C1 that passes through the center of the opening 10 of the primary conductor 110a and extends in the width direction (X-axis direction) is spaced from a center line C2 that passes through the center of the opening 10 of the primary conductor 110b and extends in the width direction (X-axis direction) by a distance M1 in the length direction (Y-axis direction). A center line C3 that passes through the center of the opening 10 of the primary conductor 110c and extends in the width direction (X-axis direction) is spaced from the position of the center line C2 by a distance M2 in the length direction (Y-axis direction).

The distance M1 between the center line C1 and the center line C2 is set so that a portion of the primary conductor 110b other than the arch-shaped portion 111 and the inverted arch-shaped portion 116 is positioned on the center lines Lc in the first current sensor unit 200a and a portion of the primary conductor 110a other than the arch-shaped portion 111 and the inverted arch-shaped portion 116 is positioned on the center lines Lc in the second current sensor unit 200b.

The distance M2 between the center line C2 and the center line C3 is set so that a portion of the primary conductor 110c other than the arch-shaped portion 111 and the inverted arch-shaped portion 116 is positioned on the center lines Lc in the second current sensor unit 200b and a portion of the primary conductor 110b other than the arch-shaped portion 111 and the inverted arch-shaped portion 116 is positioned on the center lines Lc in the third current sensor unit 200c.

Here, results of simulation analyses are described. In the simulation analyses, an influence of magnetic fields generated by the first current sensor unit 900a and the second current sensor unit 900b on a measurement value of the third current sensor unit 900c in the current sensor 900 according to the comparative example is checked. Also in the simulation analyses, an influence of magnetic fields generated by the first current sensor unit 200a and the second current sensor unit 200b on a measurement value of the third current sensor unit 200c in the current sensor 200 according to the second preferred embodiment is checked.

As conditions of the simulation analyses, the primary conductors 110a, 110b, and 110c are each preferably formed as follows: the width is about 13 mm, the thickness is about 1.5 mm, M1 and M2 are about 18.0 mm, and Hb is about 7.0 mm, for example. A current of about 600 A (about 300 A through the first flow path portion and about 300 A through the second flow path portion) is caused to flow through each of the primary conductors 110a, 110b, and 110c. Under these conditions, a magnetic flux density distribution of magnetic field to be measured on the center lines Lc are subjected to a simulation analysis. The start points and the end points of the center lines Lc are respectively one end and the other end of the primary conductor in the width direction (X-axis direction) of the primary conductors.

Figure 12:
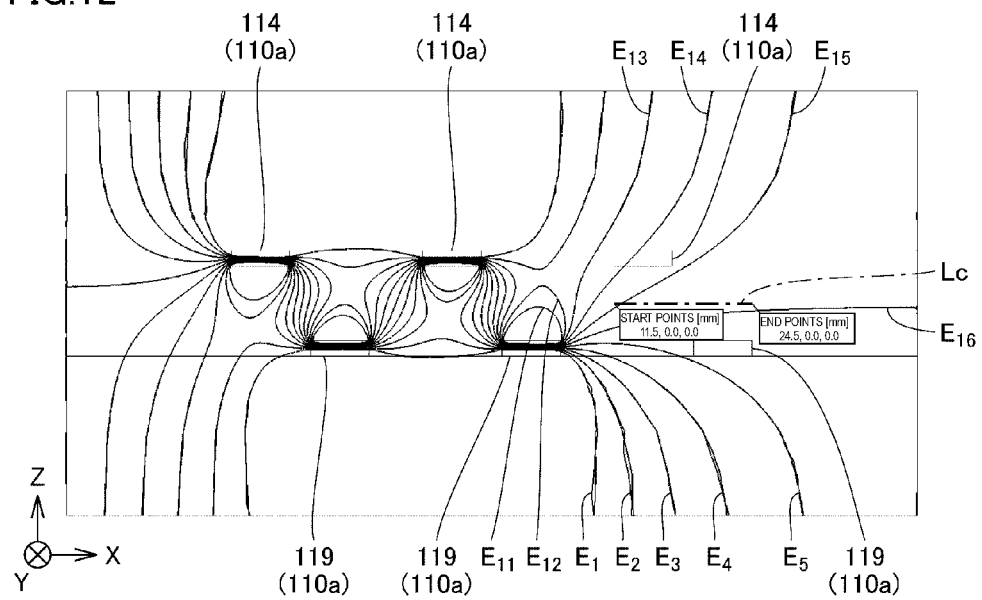
FIG. 12 is a contour drawing in the same sectional view as that of FIG. 9, illustrating results of a simulation analysis of the magnetic flux density of a magnetic field generated when currents not to be measured are caused to flow through two primary conductors of the current sensor according to the comparative example.

FIG. 12 is a contour drawing in the same sectional view as that of FIG. 9, illustrating the results of the simulation analysis of the magnetic flux density of a magnetic field generated when currents not to be measured are caused to flow through two primary conductors of the current sensor according to the comparative example. In FIG. 12, E1 to E5 are represented in the descending order of the magnetic flux density of the magnetic field oriented to the one side in the width direction (X-axis direction) of the primary conductors 110a, and E11 to E16 are represented in the descending order of the magnetic flux density of the magnetic field oriented to the other side in the width direction (X-axis direction) of the primary conductors 110a.

Figure 13:
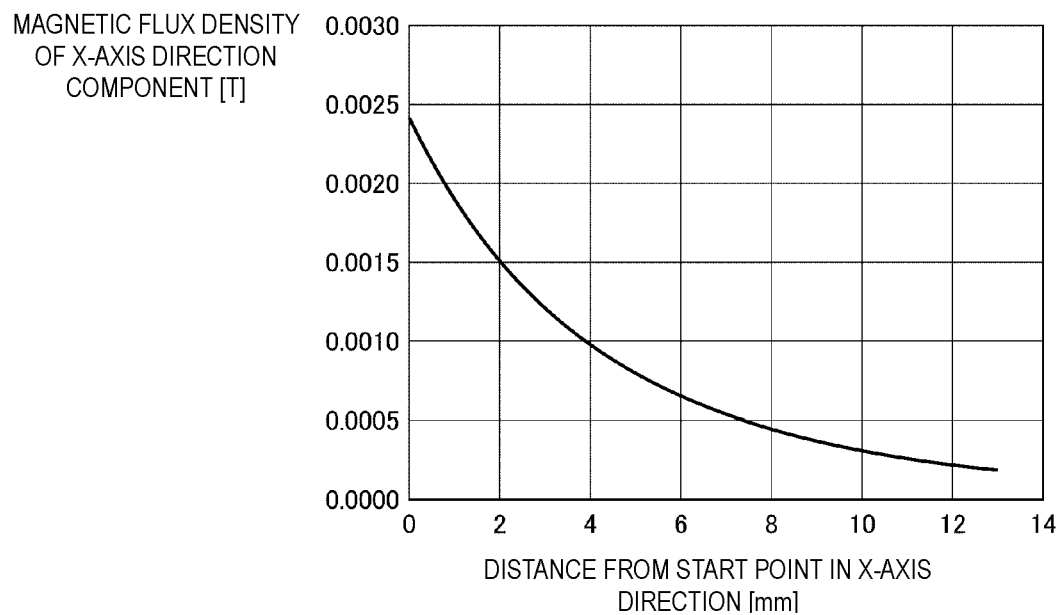
FIG. 13 is a graph illustrating displacement of the magnetic flux density of X-axis direction components from start points to end points of center lines Lc illustrated in FIG. 12.

FIG. 13 is a graph illustrating displacement of the magnetic flux density of X-axis direction components from the start points to the end points of the center lines Lc illustrated in FIG. 12. In FIG. 13, the vertical axis represents the magnetic flux density (T) of the X-axis direction components and the horizontal axis represents the distance (mm) from the start points in the X-axis direction.

Figure 14:
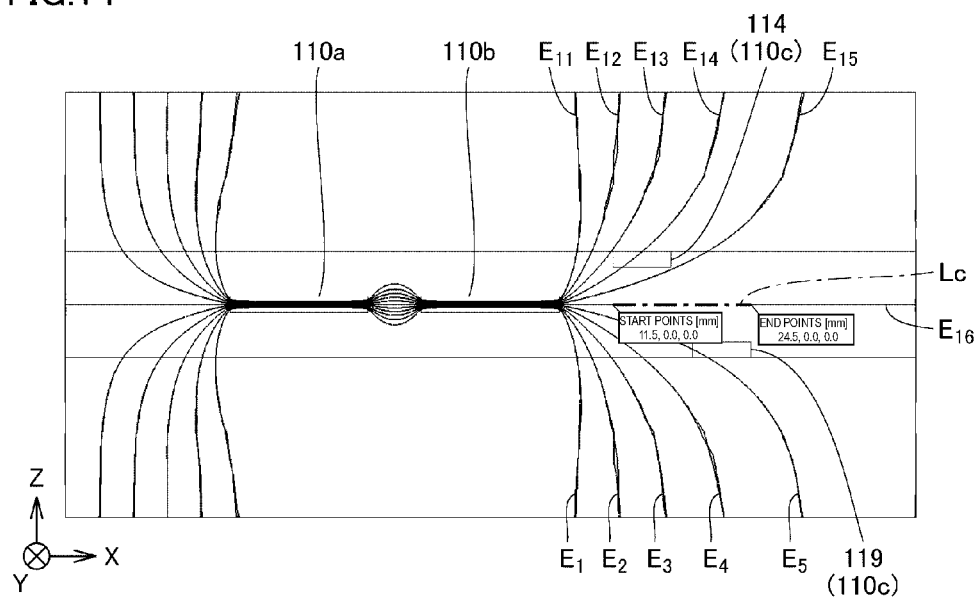
FIG. 14 is a contour drawing in the same sectional view as that of FIG. 11, illustrating results of a simulation analysis of the magnetic flux density of a magnetic field generated when currents not to be measured are caused to flow through two primary conductors of the current sensor according to a second preferred embodiment of the present invention.

FIG. 14 is a contour drawing in the same sectional view as that of FIG. 11, illustrating the results of a simulation analysis of the magnetic flux density of a magnetic field generated when currents not to be measured are caused to flow through two primary conductors of the current sensor according to the second preferred embodiment of the present invention. In FIG. 14, E1 to E5 are represented in the descending order of the magnetic flux density of the magnetic field oriented to the one side in the width direction (X-axis direction) of the primary conductors 110a, 110b, and 110c, and E11 to E16 are represented in the descending order of the magnetic flux density of the magnetic field oriented to the other side in the width direction (X-axis direction) of the primary conductor 110a.

Figure 15:
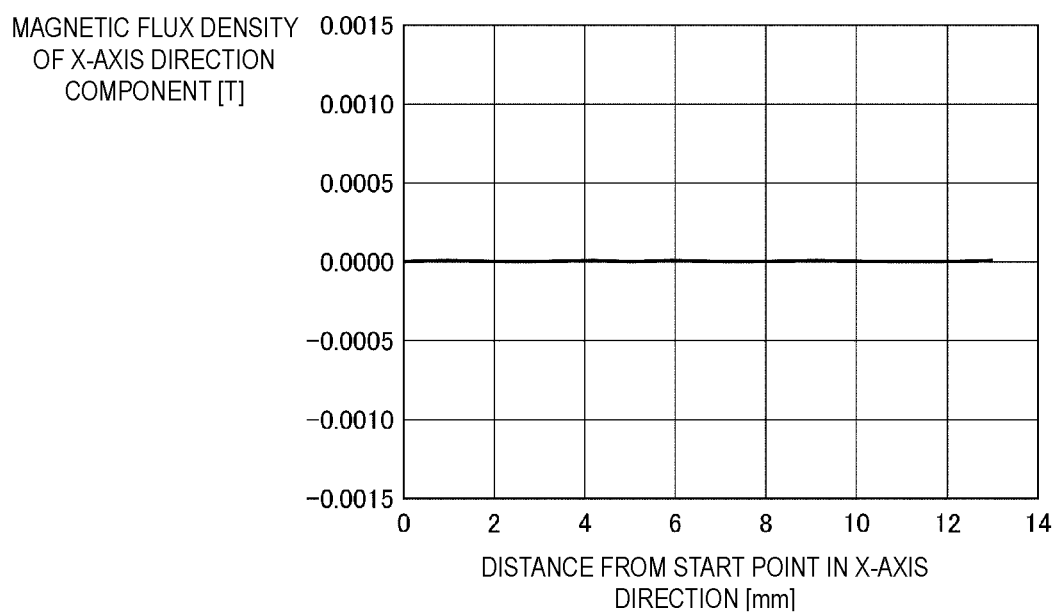
FIG. 15 is a graph illustrating displacement of the magnetic flux density of X-axis direction components from start points to end points of center lines Lc illustrated in FIG. 14.

FIG. 15 is a graph illustrating displacement of the magnetic flux density of X-axis direction components from the start points to the end points of the center lines Lc illustrated in FIG. 14. In FIG. 15, the vertical axis represents the magnetic flux density (T) of the X-axis direction components and the horizontal axis represents the distance (mm) from the start points in the X-axis direction.

As illustrated in FIG. 12, in the current sensor 900 according to the comparative example, magnetic fields oriented to the one side in the width direction (X-axis direction) of the primary conductors 110a were generated below the extended portions 114 and below the extended portions 119. The magnetic fields oriented to the other side in the width direction (X-axis direction) of the primary conductors 110a were generated above the extended portion 114 and above the extended portion 119.

As illustrated in FIG. 13, in the current sensor 900 according to the comparative example, the absolute value of the magnetic flux density of the magnetic field oriented to the other side in the width direction (X-axis direction) of the primary conductor 110a became largest at the position of the start points that are closest to the second current sensor unit 900b, and the absolute value of the magnetic flux density of the magnetic field oriented to the other side in the width direction (X-axis direction) of the primary conductor 110a decreased as the distance from the start points in the X-axis direction increased. As a result, the magnetic fields generated by each of the first current sensor unit 900a and the second current sensor unit 900b influenced the measurement value of the third current sensor unit 900c.

As illustrated in FIG. 14, in the current sensor 200 according to the second preferred embodiment of the present invention, the magnetic fields oriented to the one side in the width direction (X-axis direction) of the primary conductors 110a and 110b were generated below the primary conductors 110a and 110b. The magnetic fields oriented to the other side in the width direction (X-axis direction) of the primary conductors 110a and 110b were generated above the primary conductors 110a and 110b.

As illustrated in FIG. 15, in the current sensor 200 according to the second preferred embodiment of the present invention, the magnetic flux density of the magnetic field oriented in the width direction (X-axis direction) of the primary conductor 110a was substantially 0 or 0 throughout the center lines Lc.

From the above-described results of the simulation analyses, it can be verified that, in the current sensor 200 according to the second preferred embodiment of the present invention, influences of the magnetic fields generated by the first current sensor unit 200a and the second current sensor unit 200b on the measurement value of the third current sensor unit 200c are able to be suppressed, and accordingly, measurement errors of the third current sensor unit 200c are able to be decreased.

The similar effects are able to be obtained for the first current sensor unit 200a and the second current sensor unit 200b. As described above, in the current sensor 200 according to the present preferred embodiment, an influence of the magnetic field circling around the primary conductor adjacent to the corresponding primary conductor is able to be suppressed, and accordingly, measurement errors are able to be decreased.

Third Preferred Embodiment

A current sensor according to a third preferred embodiment of the present invention is described below. In a current sensor 300 according to the third preferred embodiment, only the disposition of the third current sensor unit is different from that of the current sensor 200 according to the second preferred embodiment. Accordingly, elements that are the same as or similar to those of the current sensor 200 according to the second preferred embodiment are denoted by the same reference signs and description thereof is not repeated.

Figure 16:
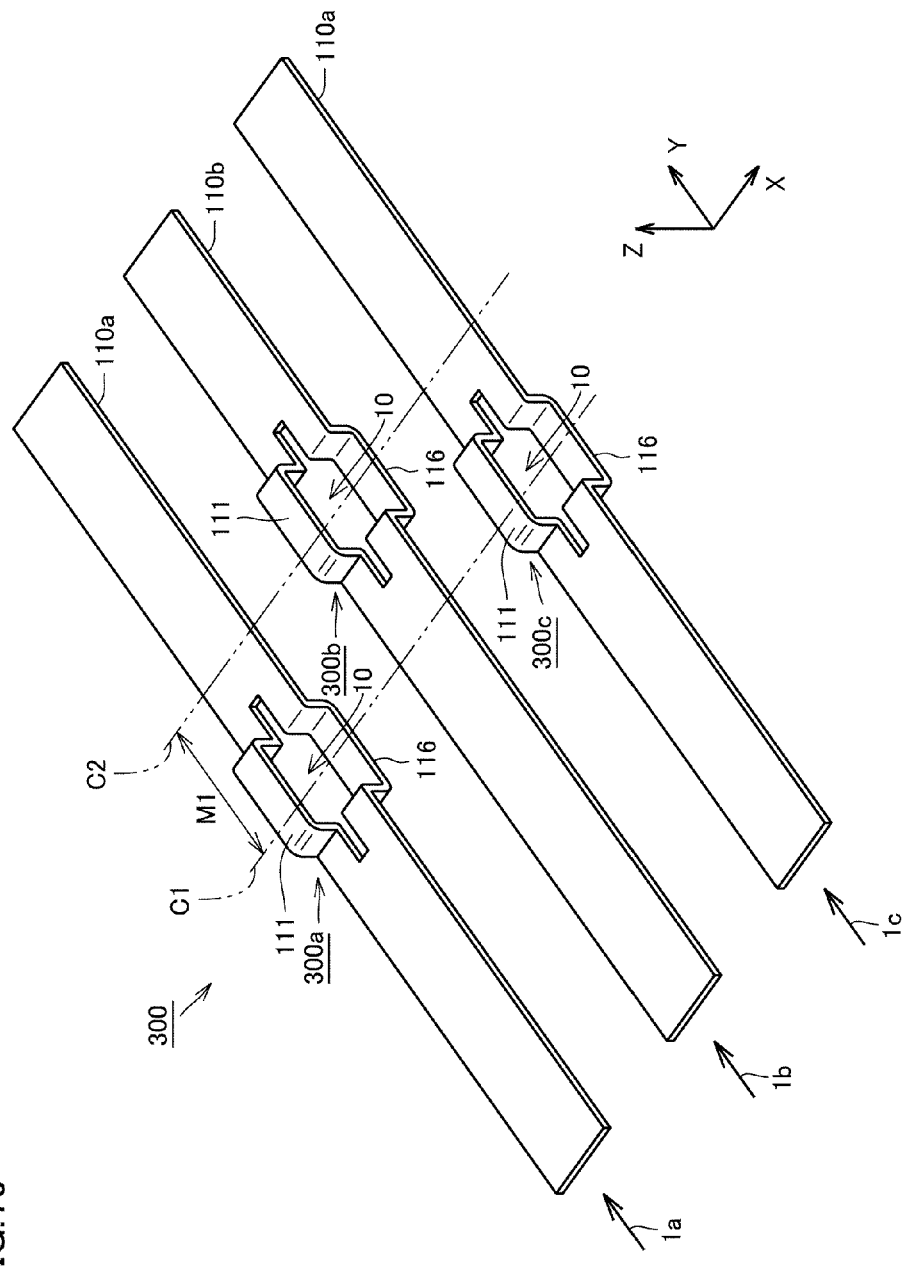
FIG. 16 is a perspective view of the appearance of a current sensor according to a third preferred embodiment of the present invention.

FIG. 16 is a perspective view of the appearance of the current sensor according to the third preferred embodiment of the present invention. Illustration of the magnetic sensor units 160 is omitted from FIG. 16.

As illustrated in FIG. 16, the current sensor 300 according to the third preferred embodiment of the present invention includes a first current sensor unit 300a, a second current sensor unit 300b, and a third current sensor unit 300c.

The first current sensor unit 300a, the second current sensor unit 300b, and the third current sensor unit 300c each include the primary conductor 110a or the primary conductor 110b. The first current sensor unit 300a, the second current sensor unit 300b, and the third current sensor unit 300c each also include the first magnetic sensor element 120a and the second magnetic sensor element 120b. The primary conductors 110a and 110b each allow a current to be measured to flow therethrough. The first magnetic sensor element 120a and the second magnetic sensor element 120b detect the strength of a magnetic field generated by the current to be measured flowing through a corresponding one of the primary conductors 110a and 110b. Specifically, in each of the first current sensor unit 300a, the second current sensor unit 300b, and the third current sensor unit 300c, the magnetic sensor unit 160 is inserted into the opening 10 of a corresponding one of the primary conductors 110a and 110b.

In each of the first current sensor unit 300a, the second current sensor unit 300b, and the third current sensor unit 300c, the current to be measured flows through a corresponding one of the primary conductors 110a and 110b as indicated by a corresponding one of arrows 1a, 1b, and 1c in the length direction (Y-axis direction) of the primary conductors 110a and 110c while being divided into two flow paths.

The primary conductors 110a and 110b of the first current sensor unit 300a, the second current sensor unit 300b, and the third current sensor unit 300c extend in the length direction (Y-axis direction) and are spaced from one another in the width direction (X-axis direction). The arch-shaped portion 111 and the inverted arch-shaped portion 116 of the first current sensor unit 300a are disposed at different positions from the positions of the arch-shaped portion 111 and the inverted arch-shaped portion 116 of the second current sensor unit 300b in the length direction (Y-axis direction). The arch-shaped portion 111 and the inverted arch-shaped portion 116 of the second current sensor unit 300b are disposed at different positions from the positions of the arch-shaped portion 111 and the inverted arch-shaped portion 116 of the third current sensor unit 300c in the length direction (Y-axis direction). The positions of the arch-shaped portion 111 and the inverted arch-shaped portion 116 of the first current sensor unit 300a are not different from the positions of the arch-shaped portion 111 and the inverted arch-shaped portion 116 of the third current sensor unit 300c in the length direction (Y-axis direction).

The arch-shaped portion 111 and the inverted arch-shaped portion 116 of the first current sensor unit 300a and the arch-shaped portion 111 and the inverted arch-shaped portion 116 of the third current sensor unit 300c are on a virtual line that extends in the width direction (X-axis direction) of the primary conductors 110a. That is, center lines C1 that pass through the centers of the openings 10 of the primary conductors 110a of the first current sensor unit 300a and the third current sensor unit 300c and that extend in the width direction (X-axis direction) are aligned.

As illustrated in FIG. 16, the center line C1 that passes through the center of the opening 10 of each of the primary conductors 110a and extends in the width direction (X-axis direction) is positioned a distance M1 away in the length direction (Y-axis direction) from the center line C2 that passes through the center of the opening 10 of the primary conductor 110b and extends in the width direction (X-axis direction).

The distance M1 between the center line C1 and the center line C2 is set so that a portion of the primary conductor 110b other than the arch-shaped portion 111 and the inverted arch-shaped portion 116 is positioned on the center lines Lc in each of the first current sensor unit 300a and the third current sensor unit 300c, and a portion of each of the primary conductors 110a other than the arch-shaped portion 111 and the inverted arch-shaped portion 116 is positioned on the center lines Lc in the second current sensor unit 300b.

When the arch-shaped portions 111 and the inverted arch-shaped portions 116 of the adjacent primary conductors are disposed at different positions from one another in the length direction (Y-axis direction) of the primary conductors as is the case with the current sensor 300 according to the present preferred embodiment, an influence of the magnetic fields circling around the adjacent primary conductors on the corresponding primary conductor is able to be suppressed, and accordingly, measurement errors are able to be decreased. Thus, unlike the case with the current sensor 200 according to second preferred embodiment, it is not required that the arch-shaped portion 111 and the inverted arch-shaped portion 116 of the primary conductors 110a, 110b, and 110c be disposed at different positions from one another in the length direction (Y-axis direction) of the primary conductors.

Fourth Preferred Embodiment

A current sensor according to a fourth preferred embodiment of the present invention is described below. In the current sensor according to the fourth preferred embodiment, only the shape of the primary conductors is different from that of the current sensor 100 according to the first preferred embodiment. Accordingly, description of elements that are the same as or similar to those of the current sensor 100 according to the first preferred embodiment is not repeated.

Figure 17:
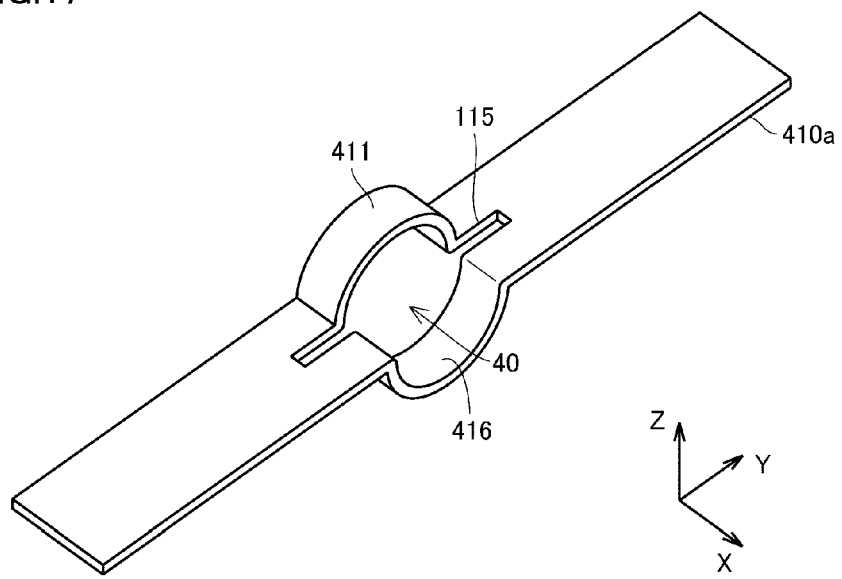
FIG. 17 is a perspective view of the appearance of one of primary conductors included in a current sensor according to a fourth preferred embodiment of the present invention.

FIG. 17 is a perspective view of the appearance of one of the primary conductors included in the current sensor according to the fourth preferred embodiment of the present invention. As illustrated in FIG. 17, a primary conductor 410a included in the current sensor according to the fourth preferred embodiment of the present invention includes an arch-shaped portion 411 and an inverted arch-shaped portion 416. The arch-shaped portion 411 and the inverted arch-shaped portion 416 each have a semi-circular shape when seen in the width direction (X-axis direction) of the primary conductor 410a. An opening 40 is provided inside the arch-shaped portion 411 and the inverted arch-shaped portion 416. A magnetic sensor unit is inserted into the opening 40 of the primary conductor 410a. A housing of the magnetic sensor unit of the current sensor according to a preferred embodiment of the present invention has a cylindrical or substantially cylindrical external shape.

In the current sensor according to the present preferred embodiment, an influence of the external magnetic field and the magnetic field circling around the primary conductor adjacent to the corresponding primary conductor is able to be suppressed. Thus, measurement errors are able to be decreased and size-reduction are able to be realized.

Fifth Preferred Embodiment

A current sensor according to a fifth preferred embodiment of the present invention is described below. In the current sensor according to the fifth preferred embodiment, only the shape of the primary conductors is different from that of the current sensor 100 according to the first preferred embodiment. Accordingly, description of elements that are the same as or similar to those of the current sensor 100 according to the first preferred embodiment is not repeated.

Figure 18:
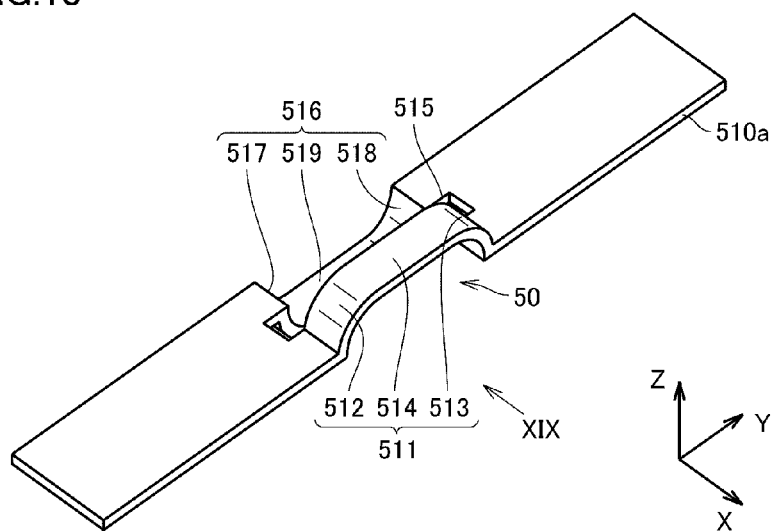
FIG. 18 is a perspective view of the appearance of one of primary conductors included in a current sensor according to a fifth preferred embodiment of the present invention.
Figure 19:
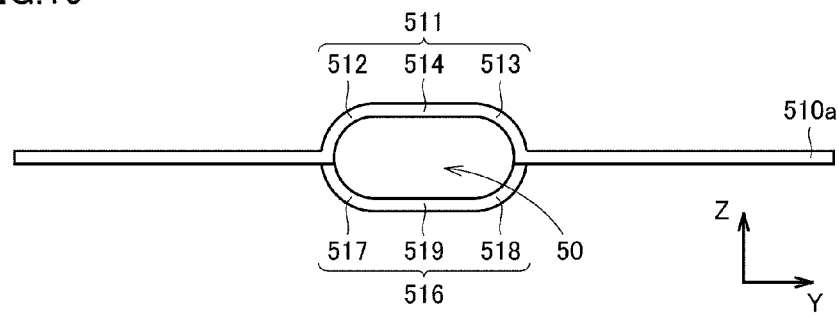
FIG. 19 is a side view of the primary conductor illustrated in FIG. 18 seen in an arrow XIX direction.

FIG. 18 is a perspective view of the appearance of one of the primary conductors included in the current sensor according to the fifth preferred embodiment of the present invention. FIG. 19 is a side view of the primary conductor illustrated in FIG. 18 seen in an arrow XIX direction.

As illustrated in FIGS. 18 and 19, a plate-shaped primary conductor 510a included in the current sensor according to the fifth preferred embodiment of the present invention includes a front surface and rear surface and has the length direction (Y-axis direction), the width direction (X-axis direction) perpendicular or substantially perpendicular to the length direction (Y-axis direction), and the thickness direction (Z-axis direction) perpendicular or substantially perpendicular to the length direction (Y-axis direction) and the width direction (X-axis direction).

According to the present preferred embodiment, when seen in the width direction (X-axis direction) of the primary conductor 510a, a first flow path portion 511 bulges out on the front surface side of the primary conductor 510a. When seen in the width direction (X-axis direction) of the primary conductor 510a, a second flow path portion 516 bulges out on the rear surface side of the primary conductor 510a. The second flow path portion 516 is located beside the first flow path portion 511 in the width direction (X-axis direction) of the primary conductor 510a. When seen in the width direction (X-axis direction) of the primary conductor 510a, a surrounded region 50 is defined by the first flow path portion 511 and the second flow path portion 516. A slit 515 is positioned at the center of the primary conductor 510a in the width direction (X-axis direction) of the primary conductor 510a.

Each of the first flow path portion 511 and the second flow path portion 516 preferably has a semi-elliptical shape when seen in the width direction (X-axis direction) of the primary conductor 510a. The first flow path portion 511 includes a first projecting portion 512, a second projecting portion 513, and an extended portion 514. The first projecting portion 512 and the second projecting portion 513 are spaced from each other and project so as to have arc shapes from the front surface of the primary conductor 510a. The extended portion 514 extends in the length direction (Y-axis direction) of the primary conductor 510a so as to connect the first projecting portion 512 and the second projecting portion 513 to each other. The second flow path portion 516 includes a third projecting portion 517, a fourth projecting portion 518, and an extended portion 519. The third projecting portion 517 and the fourth projecting portion 518 are spaced from each other and project so as to have arc shapes from the rear surface of the primary conductor 510a. The extended portion 519 extends in the length direction (Y-axis direction) of the primary conductor 510a so as to connect the third projecting portion 517 and the fourth projecting portion 518 to each other.

The magnetic sensor unit is inserted into a space provided by the first flow path portion 511 and the second flow path portion 516. Thus, the first magnetic sensor element 120a is disposed at a position that is in the region 50 when seen in the width direction (X-axis direction) of the primary conductor 510a and on the rear surface side of the first flow path portion 511 when seen in the thickness direction (Z-axis direction) of the primary conductor 510a. The second magnetic sensor element 120b is disposed at a position that is in the region 50 when seen in the width direction (X-axis direction) of the primary conductor 510a and on the front surface side of the second flow path portion 516 when seen in the thickness direction (Z-axis direction) of the primary conductor 510a.

In the current sensor according to the present preferred embodiment, an influence of the external magnetic field and the magnetic field circling around the primary conductor adjacent to the corresponding primary conductor is able to be suppressed. Thus, measurement errors are able to be decreased and size-reduction are able to be realized.

Sixth Preferred Embodiment

A current sensor according to a sixth preferred embodiment of the present invention is described below. In the current sensor according to the sixth preferred embodiment, only the shape of the primary conductors is different from that of the current sensor 100 according to the first preferred embodiment. Accordingly, description of elements that are the same as or similar to those of the current sensor 100 according to the first preferred embodiment is not repeated.

Figure 20:
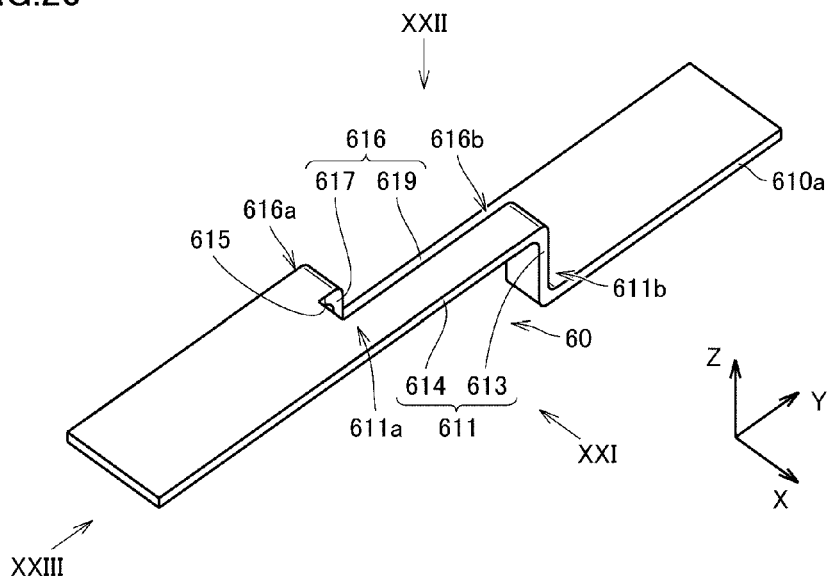
FIG. 20 is a perspective view of the appearance of one of primary conductors included in a current sensor according to a sixth preferred embodiment of the present invention.
Figure 21:
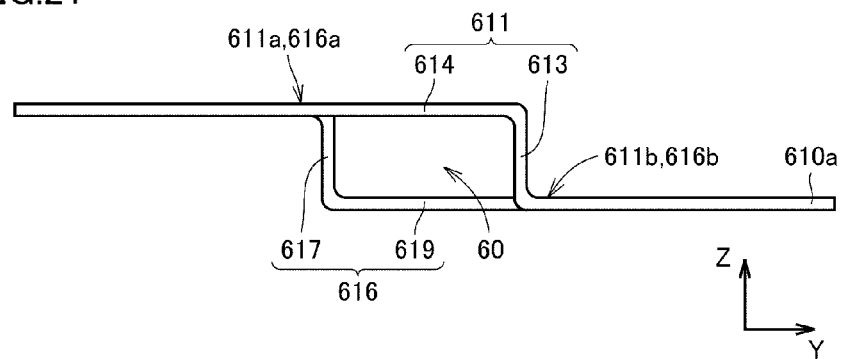
FIG. 21 is a side view of the primary conductor illustrated in FIG. 20 seen in an arrow XXI direction.
Figure 22:
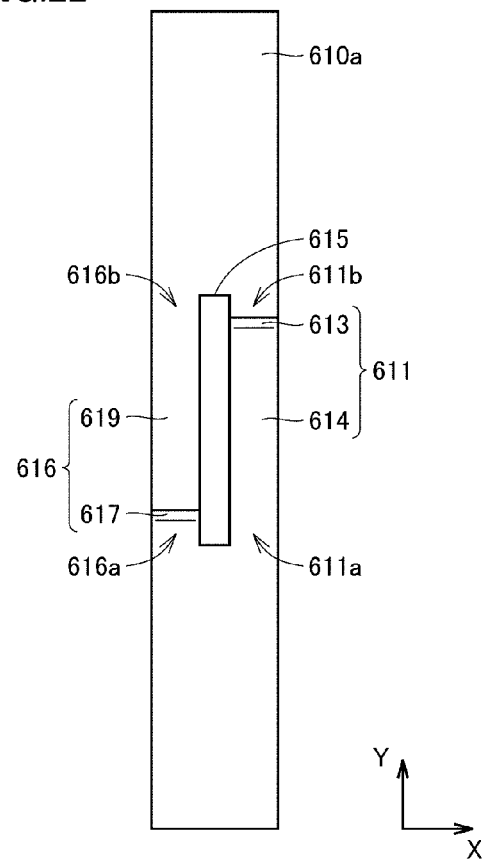
FIG. 22 is a top view of the primary conductor illustrated in FIG. 20 seen in an arrow XXII direction.
Figure 23:
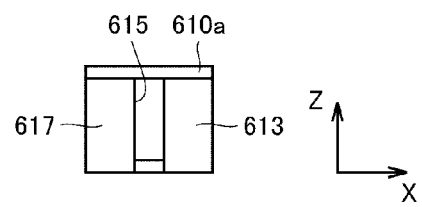
FIG. 23 is a front view of the primary conductor illustrated in FIG. 20 seen in an arrow XXIII direction.

FIG. 20 is a perspective view of the appearance of one of the primary conductors included in the current sensor according to the sixth preferred embodiment of the present invention. FIG. 21 is a side view of the primary conductor illustrated in FIG. 20 seen in an arrow XXI direction. FIG. 22 is a top view of the primary conductor illustrated in FIG. 20 seen in an arrow XXII direction. FIG. 23 is a front view of the primary conductor illustrated in FIG. 20 seen in an arrow XXIII direction.

As illustrated in FIGS. 20 to 23, a plate-shaped primary conductor 610a included in the current sensor according to the sixth preferred embodiment of the present invention includes a front surface and rear surface and has the length direction (Y-axis direction), the width direction (X-axis direction) perpendicular or substantially perpendicular to the length direction (Y-axis direction), and the thickness direction (Z-axis direction) perpendicular or substantially perpendicular to the length direction (Y-axis direction) and the width direction (X-axis direction).

According to the present preferred embodiment, a second flow path portion 616 is arranged beside a first flow path portion 611 in the width direction (X-axis direction) of the primary conductor 610a. When seen in the width direction (X-axis direction) of the primary conductor 610a, a surrounded region 60 is defined by the first flow path portion 611 and the second flow path portion 616. A slit 615 is positioned at the center of the primary conductor 610a in the width direction (X-axis direction) of the primary conductor 610a.

The first flow path portion 611 includes one end 611a and the other end 611b in the length direction (Y-axis direction). The second flow path portion 616 includes one end 616a and the other end 616b in the length direction (Y-axis direction). The one end 611a of the first flow path portion 611 and the one end 616a of the second flow path portion 616 are positioned side-by-side in the width direction (X-axis direction) with the slit 615 interposed therebetween. The other end 611b of the first flow path portion 611 and the other end 616b of the second flow path portion 616 are positioned side-by-side in the width direction (X-axis direction) of the primary conductor 610a with the slit 615 interposed therebetween.

The one end 611a of the first flow path portion 611 and the other end 611b of the first flow path portion 611 in the length direction (Y-axis direction) of the primary conductor 610a are disposed at different positions from each other in the thickness direction (Z-axis direction) of the primary conductor 610a. The one end 616a of the second flow path portion 616 and the other end 616b of the second flow path portion 616 in the length direction (Y-axis direction) are disposed at different positions from each other in the thickness direction (Z-axis direction) of the primary conductor 610a. The one end 611a of the first flow path portion 611 and the one end 616a of the second flow path portion 616 in the length direction (Y-axis direction) of the primary conductor 610a are located at the same position in the thickness direction (Z-axis direction) of the primary conductor 610a. The other end 611b of the first flow path portion 611 and the other end 616b of the second flow path portion 616 in the length direction (Y-axis direction) of the primary conductor 610a are located at the same position in the thickness direction (Z-axis direction) of the primary conductor 610a.

The first flow path portion 611 includes a bent portion 613 that connects the position of the one end 611a of the first flow path portion 611 and the position of the other end 611b of the first flow path portion 611 to each other in the thickness direction (Z-axis direction) of the primary conductor 610a. The second flow path portion 616 includes a bent portion 617 that connects the position of the one end 616a of the second flow path portion 616 and the position of the other end 616b of the second flow path portion 616 to each other in the thickness direction (Z-axis direction) of the primary conductor 610a. The bent portion 613 of the first flow path portion 611 and the bent portion 617 of the second flow path portion 616 are spaced from each other in the length direction (Y-axis direction) of the primary conductor 610a.

According to the present preferred embodiment, the first flow path portion 611 includes an extended portion 614 and the bent portion 613. The extended portion 614 extends from the one end 611a in the length direction (Y-axis direction). The bent portion 613 linearly extends toward the other end 611b in the thickness direction (Z-axis direction) from an end portion of the extended portion 614 in the length direction (Y-axis direction). That is, the first flow path portion 611 has a step shape. The extended portion 614 is in contact with the one end 611a of the first flow path portion 611. The bent portion 613 is in contact with the other end 611b of the first flow path portion 611. The shape of the bent portion 613 is not limited to the above description. When seen in the width direction (X-axis direction) of the primary conductor 610a, the bent portion 613 may linearly extend in a direction intersecting the length direction (Y-axis direction) and the thickness direction (Z-axis direction) of the primary conductor 610a or may be curved.

The second flow path portion 616 includes the bent portion 617 and an extended portion 619. The bent portion 617 linearly extends from the one end 616a in the thickness direction (Z-axis direction). The extended portion 619 extends from an end portion of the bent portion 617 in the thickness direction (Z-axis direction) toward the other end 616b in the length direction (Y-axis direction). That is, the second flow path portion 616 has a step shape. The extended portion 619 is in contact with the other end 616b of the second flow path portion 616. The bent portion 617 is in contact with the one end 616a of the second flow path portion 616. The shape of the bent portion 617 is not limited to the above description. When seen in the width direction (X-axis direction) of the primary conductor 610a, the bent portion 617 may linearly extend in a direction intersecting the length direction (Y-axis direction) and the thickness direction (Z-axis direction) of the primary conductor 610a or may be curved.

The magnetic sensor unit is inserted into a space defined by the first flow path portion 611 and the second flow path portion 616. Thus, the first magnetic sensor element 120a is disposed at a position that is in the region 60 when seen in the width direction (X-axis direction) of the primary conductor 610a and on the rear surface side of the first flow path portion 611 when seen in the thickness direction (Z-axis direction) of the primary conductor 610a. The second magnetic sensor element 120b is disposed at a position that is in the region 60 when seen in the width direction (X-axis direction) of the primary conductor 610a and on the front surface side of the second flow path portion 616 when seen in the thickness direction (Z-axis direction) of the primary conductor 610a.

In the current sensor according to the present preferred embodiment, an influence of the external magnetic field and the magnetic field circling around the primary conductor adjacent to the corresponding primary conductor is able to be suppressed. Thus, measurement errors are able to be decreased and size-reduction are able to be realized.

Seventh Preferred Embodiment

A current sensor according to a seventh preferred embodiment of the present invention is described below. A main difference between the current sensor 200 according to the second preferred embodiment and the current sensor according to the seventh preferred embodiment is that current sensor units according to the seventh preferred embodiment are arranged in the thickness direction of the primary conductors. Accordingly, description of elements that are the same as or similar to those of the current sensor 200 according to the second preferred embodiment is not repeated.

Figure 24:
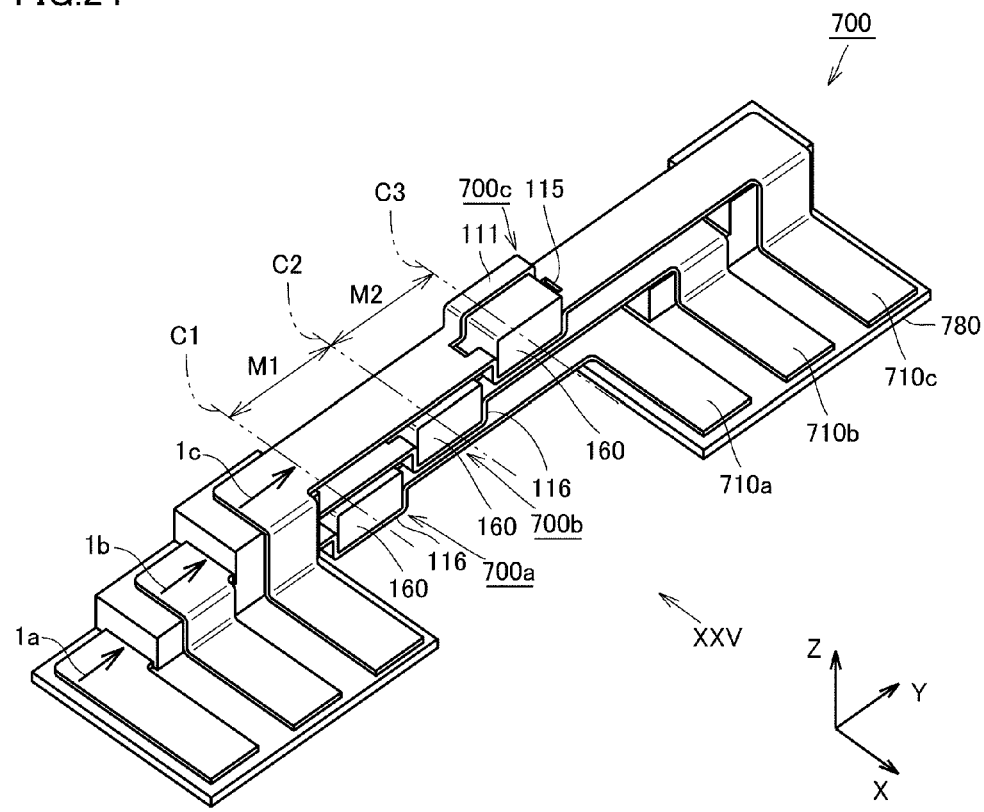
FIG. 24 is a perspective view of the appearance of a current sensor according to a seventh preferred embodiment of the present invention.
Figure 25:
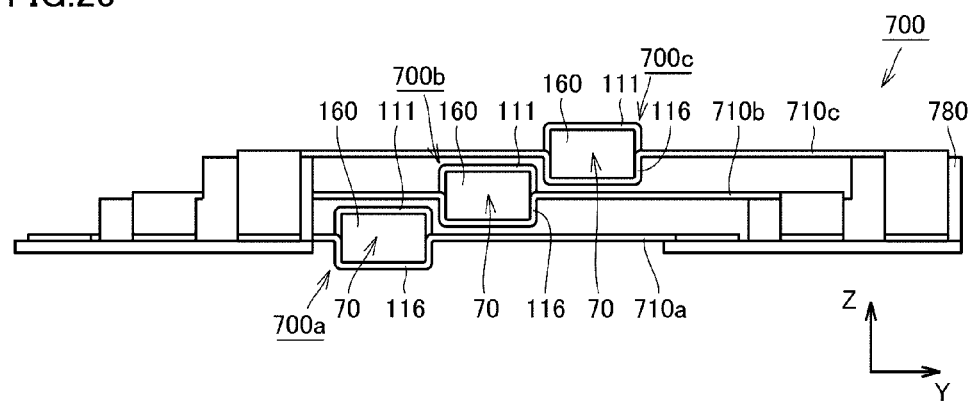
FIG. 25 is a side view of the current sensor illustrated in FIG. 24 seen in a XXV direction.

FIG. 24 is a perspective view of the appearance of the current sensor according to the seventh preferred embodiment of the present invention. FIG. 25 is a side view of the current sensor illustrated in FIG. 24 seen in a XXV direction. As illustrated in FIGS. 24 and 25, a current sensor 700 according to the seventh preferred embodiment of the present invention includes a first current sensor unit 700a, a second current sensor unit 700b, and a third current sensor unit 700c.

The first current sensor unit 700a, the second current sensor unit 700b, and the third current sensor unit 700c respectively include a primary conductor 710a, a primary conductor 710b, and a primary conductor 710c. Also, the first current sensor unit 700a, the second current sensor unit 700b, and the third current sensor unit 700c each include the first magnetic sensor element 120a and the second magnetic sensor element 120b. The primary conductors 710a, 710b, and 710c each allow a current to be measured to flow therethrough. The first magnetic sensor element 120a and the second magnetic sensor element 120b detect the strength of a magnetic field generated by the current to be measured flowing through a corresponding one of the primary conductors 710a, 710b, and 710c. Specifically, in each of the first current sensor unit 200a, the second current sensor unit 200b, and the third current sensor unit 200c, the magnetic sensor unit 160 is inserted into an opening 70 of a corresponding one of the primary conductors 710a, 710b, and 710c.

In each of the first current sensor unit 700a, the second current sensor unit 700b, and the third current sensor unit 700c, the current to be measured flows through a corresponding one of the primary conductors 710a, 710b, and 710c as indicated by a corresponding one of arrows 1a, 1b, and 1c in the length direction (Y-axis direction) of the primary conductors 710a, 710b, and 710c while being divided into two flow paths.

The primary conductors 710a, 710b, and 710c of the first current sensor unit 700a, the second current sensor unit 700b, and the third current sensor unit 700c extend, are spaced from one another, and are parallel or substantially parallel to one another in the length direction (Y-axis direction). According to the present preferred embodiment, the primary conductors 710a, 710b, and 710c are positioned with a space provided therebetween in the thickness direction (Z-axis direction). The arch-shaped portion 111 and the inverted arch-shaped portion 116 of the first current sensor unit 700a, the arch-shaped portion 111 and the inverted arch-shaped portion 116 of the second current sensor unit 700b, and the arch-shaped portion 111 and the inverted arch-shaped portion 116 of the third current sensor unit 700c are disposed at different positions from one another in the length direction (Y-axis direction).

Specifically, as illustrated in FIGS. 24 and 25, a center line C1 that passes through the center of the opening 70 of the primary conductor 710a and extends in the width direction (X-axis direction) is positioned a distance M1 away in the length direction (Y-axis direction) from a center line C2 that passes through the center of the opening 70 of the primary conductor 710b and extends in the width direction (X-axis direction). A center line C3 that passes through the center of the opening 70 of the primary conductor 710c and extends in the width direction (X-axis direction) is positioned a distance M2 away in the length direction (Y-axis direction) from the center line C2.

As a result, when seen in the width direction (X-axis direction) of the primary conductors 710a, 710b, and 710c, the first magnetic sensor element 120a and the second magnetic sensor element 120b of the first current sensor unit 700a are positioned outside the opening 70 of each of the second current sensor unit 700b and the third current sensor unit 700c. When seen in the width direction (X-axis direction) of the primary conductors 710a, 710b, and 710c, the first magnetic sensor element 120a and the second magnetic sensor element 120b of the second current sensor unit 700b are positioned outside the opening 70 of each of the first current sensor unit 700a and the third current sensor unit 700c. When seen in the width direction (X-axis direction) of the primary conductors 710a, 710b, and 710c, the first magnetic sensor element 120a and the second magnetic sensor element 120b of the third current sensor unit 700c are positioned outside the opening 70 of each of the first current sensor unit 700a and the second current sensor unit 700b.

When seen in the thickness direction (Z-axis direction) of the primary conductors 710a, 710b, and 710c, the first magnetic sensor element 120a and the second magnetic sensor element 120b of the first current sensor unit 700a are superposed on the primary conductor 710b of the second current sensor unit 700b and the primary conductor 710c of the third current sensor unit 700c. When seen in the thickness direction (Z-axis direction) of the primary conductors 710a, 710b, and 710c, the first magnetic sensor element 120a and the second magnetic sensor element 120b of the second current sensor unit 700b are superposed on the primary conductor 710a of the first current sensor unit 700a and the primary conductor 710c of the third current sensor unit 700c. When seen in the thickness direction (Z-axis direction) of the primary conductors 710a, 710b, and 710c, the first magnetic sensor element 120a and the second magnetic sensor element 120b of the third current sensor unit 700c are superposed on the primary conductor 710a of the first current sensor unit 700a and the primary conductor 710b of the second current sensor unit 700b.

As a result, a magnetic field circling around the primary conductor 710b acts on the first magnetic sensor element 120a and the second magnetic sensor element 120b of the first current sensor unit 700a in a similar manner. A magnetic field circling around the primary conductor 710c acts on the first magnetic sensor element 120a and the second magnetic sensor element 120b of the first current sensor unit 700a in a similar manner. Thus, as is the case with the external magnetic field, an influence of the magnetic field circling around the primary conductor 710b and the magnetic field circling around the primary conductor 710c on a measurement value of the first current sensor unit 700a is able to be suppressed.

Likewise, a magnetic field circling around the primary conductor 710a acts on the first magnetic sensor element 120a and the second magnetic sensor element 120b of the second current sensor unit 700b in a similar manner. A magnetic field circling around the primary conductor 710c acts on the first magnetic sensor element 120a and the second magnetic sensor element 120b of the second current sensor unit 700b in a similar manner. Thus, as is the case with the external magnetic field, an influence of the magnetic field circling around the primary conductor 710a and the magnetic field circling around the primary conductor 710c on a measurement value of the second current sensor unit 700b is able to suppressed.

Likewise, a magnetic field circling around the primary conductor 710a acts on the first magnetic sensor element 120a and the second magnetic sensor element 120b of the third current sensor unit 700c in a similar manner. A magnetic field circling around the primary conductor 710b acts on the first magnetic sensor element 120a and the second magnetic sensor element 120b of the third current sensor unit 700c in a similar manner. Thus, as is the case with the external magnetic field, an influence of the magnetic field circling around the primary conductor 710a and the magnetic field circling around the primary conductor 710b on a measurement value of the third current sensor unit 700c is able to be suppressed.

As described above, in the current sensor 700 according to the present preferred embodiment, an influence of the external magnetic field and the magnetic field circling around the primary conductor adjacent to the corresponding primary conductor is able to be suppressed. Thus, measurement errors are able to be decreased.

In the above description of the preferred embodiments, elements that can be combined may be combined with each other. In the current sensor, the housing may be integral with the corresponding primary conductor or detachably attached to the primary conductor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A current sensor comprising:
a first current sensor unit; and
a second current sensor unit; wherein
each of the first current sensor unit and the second current sensor unit includes:
  a conductor through which a current to be measured flows, which includes a front surface and a rear surface, and which has a length direction, a width direction perpendicular or substantially perpendicular to the length direction, and a thickness direction perpendicular or substantially perpendicular to the length direction and the width direction; and
  a first magnetic sensor element and a second magnetic sensor element that detect a strength of a magnetic field generated by the current; wherein
in each of the first current sensor unit and the second current sensor unit, the conductor includes a first flow path portion and a second flow path portion that allow the current to be divided in a middle portion in the length direction and to flow therethrough, and, when seen in the width direction, a surrounded region is defined by the first flow path portion and the second flow path portion;
when seen in the width direction, the first magnetic sensor element is disposed at a position that is in the surrounded region and on a rear surface side of the first flow path portion;
when seen in the width direction, the second magnetic sensor element is disposed at a position that is in the surrounded region and on a front surface side of the second flow path portion;
the conductors of the first current sensor unit and the second current sensor unit extend in the length direction and are parallel or substantially parallel to each other with a space located therebetween;

areas occupied by the first current sensor unit and the region of the second current sensor unit are disposed at different positions from each other in the length direction such that the first magnetic sensor element and the second magnetic sensor element of the first current sensor unit are positioned outside the area of the second current sensor unit when seen in the width direction and the first magnetic sensor element and the second magnetic sensor element of the second current sensor unit are positioned outside the area of the first current sensor unit when seen in the width direction.

2. The current sensor according to claim 1, wherein
in the width direction, the conductors of the first current sensor unit and the second current sensor unit are positioned side-by-side with a space provided therebetween; and
when seen in the width direction, the first magnetic sensor element and the second magnetic sensor element of the first current sensor unit are superposed on the conductor of the second current sensor unit and, when seen in the width direction, the first magnetic sensor element and the second magnetic sensor element of the second current sensor unit are superposed on the conductor of the first current sensor unit.

3. The current sensor according to claim 1, wherein
in the thickness direction, the conductors of the first current sensor unit and the second current sensor unit are positioned side-by-side with a space provided therebetween; and
when seen in the thickness direction, the first magnetic sensor element and the second magnetic sensor element of the first current sensor unit are superposed on the conductor of the second current sensor unit and, when seen in the thickness direction, the first magnetic sensor element and the second magnetic sensor element of the second current sensor unit are superposed on the conductor of the first current sensor unit.

4. The current sensor according to claim 1, wherein the conductor includes an arch-shaped portion that is bent so as to project toward one side in the thickness direction, that extends in the length direction, and that is included in the first flow path portion.

5. The current sensor according to claim 4, wherein the conductor includes an inverted arch-shaped portion that is bent so as to project toward another side in the thickness direction, that extends in the length direction, and that is included in the second flow path portion.

6. The current sensor according to claim 5, wherein, in each of the first current sensor unit and the second current sensor unit, a shape of the arch-shaped portion and a shape of the inverted arch-shaped portion are identical to each other.

7. The current sensor according to claim 4, wherein the arch-shaped portion has a C-shape or a semi-circular shape.

8. The current sensor according to claim 1, wherein, when seen in the width direction, the first flow path portion bulges out on the front surface side of the conductor.

9. The current sensor according to claim 8, wherein, when seen in the width direction, the second flow path portion bulges out on the rear surface side of the conductor.

10. The current sensor according to claim 1, wherein
each of the first flow path portion and the second flow path portion includes one end and another end in the length direction;
the one end of the first flow path portion and the other end of the first flow path portion in the length direction are at different positions from each other in the thickness direction;
the one end of the second flow path portion and the other end of the second flow path portion in the length direction are disposed at different positions from each other in the thickness direction;
the one end of the first flow path portion and the one end of the second flow path portion in the length direction are located at identical positions to each other in the thickness direction;
the other end of the first flow path portion and the other end of the second flow path portion in the length direction are located at identical positions to each other in the thickness direction;
the first flow path portion includes a bent portion that connects a position of the one end of the first flow path portion and a position of the other end of the first flow path portion in the thickness direction to each other;
the second flow path portion includes a bent portion that connects a position of the one end of the second flow path portion and a position of the other end of the second flow path portion in the thickness direction to each other; and
the bent portion of the first flow path portion and the bent portion of the second flow path portion are spaced from each other in the length direction.

11. The current sensor according to claim 1, wherein, in each of the first current sensor unit and the second current sensor unit, the conductor includes a slit that extends in the length direction such that the first flow path portion and the second flow path portion are spaced from each other in the width direction.

12. The current sensor according to claim 11, wherein, in each of the first current sensor unit and the second current sensor unit, the slit is positioned at a center of the conductor in the width direction.

13. The current sensor according to claim 1, wherein, in each of the first current sensor unit and the second current sensor unit, the first magnetic sensor element and the second magnetic sensor element are mounted in or on a single board.

14. The current sensor according to claim 1, wherein
each of the first current sensor unit and the second current sensor unit includes a calculator that calculates a value of the current by performing computation on a detection value of the first magnetic sensor element and a detection value of the second magnetic sensor element; and
in each of the first current sensor unit and the second current sensor unit, with respect to a strength of the magnetic field generated by the current flowing through the conductor, a phase of the detection value of the first magnetic sensor element and a phase of the detection value of the second magnetic sensor element are opposite to each other, and the calculator is a subtractor or a differential amplifier.

15. The current sensor according to claim 1, wherein
each of the first current sensor unit and the second current sensor unit includes a calculator that calculates a value of the current by performing computation on a detection value of the first magnetic sensor element and a detection value of the second magnetic sensor element; and
in each of the first current sensor unit and the second current sensor unit, with respect to a strength of the magnetic field generated by the current flowing through the conductor, the detection value of the first magnetic sensor element and the detection value of the second magnetic sensor element are in phase with each other, and the calculator is an adder or a summing amplifier.

16. The current sensor according to claim 1, wherein
in each of the first current sensor unit and the second current sensor unit, the first magnetic sensor element and the second magnetic sensor element include respective detection axes and are disposed so that the detection axes are oriented in the width direction; and
detection sensitivity of each of the first magnetic sensor element and the second magnetic sensor element varies in accordance with a strength of a bias magnetic field in the length direction.

17. The current sensor according to claim 1, wherein the conductor is plate-shaped.

18. The current sensor according to claim 1, wherein the conductor includes a first projecting portion, a second projecting portion, and an extended portion.

19. The current sensor according to claim 18, wherein the conductor includes a fourth projecting portion, a sixth projecting portion, and another extended portion.

20. The current sensor according to claim 1, further comprising a housing attached to or integral with the conductor.

* * * * *